(12) United States Patent
Smeys et al.

(10) Patent No.: US 8,338,913 B2
(45) Date of Patent: Dec. 25, 2012

(54) SEMICONDUCTOR INDUCTOR WITH A SERPENTINE SHAPED CONDUCTIVE WIRE INTERLACED WITH A SERPENTINE SHAPED FERROMAGNETIC CORE

(75) Inventors: Peter Smeys, San Jose, CA (US); Andrei Papou, San Jose, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 107 days.

(21) Appl. No.: 12/943,391

(22) Filed: Nov. 10, 2010

(65) Prior Publication Data
US 2012/0112296 A1    May 10, 2012

(51) Int. Cl.
*H01L 29/82* (2006.01)

(52) U.S. Cl. . 257/531; 257/421; 257/528; 257/E29.323; 336/225

(58) Field of Classification Search ........... 257/E21.022, 257/E27.114–E27.117, 528, 241; 336/232, 336/196, 213, 225, 229
See application file for complete search history.

(56) References Cited

U.S. PATENT DOCUMENTS

| | | | |
|---|---|---|---|
| 6,452,247 | B1 | 9/2002 | Gardner |
| 6,990,725 | B2 * | 1/2006 | Fontanella et al. .......... 29/602.1 |
| 7,705,421 | B1 | 4/2010 | Yegnashankaran |
| 2004/0157370 | A1 | 8/2004 | Gardner |
| 2006/0267216 | A1 | 11/2006 | Li et al. |
| 2008/0054397 | A1 | 3/2008 | Jung |
| 2010/0259349 | A1 | 10/2010 | Li |

OTHER PUBLICATIONS

"A new toroidal-meander type integrated inductor with a multilevel meander magnetic core" IEEE Transactions on Magnetics, Date of Publication: Jan. 1994 Author(s): Ahn, C.H. Microelectron. Res. Center, Georgia Inst. of Technol., Atlanta, GA Allen, M.G. vol. 30, Issue: 1 , on pp. 73-79.*
"Micromachined planar inductors on silicon wafers for MEMS applications" IEEE Transactions on Industrial Electronics, Date of Publication: Dec. 1998 Author(s): Ahn, C.H. Sch. Of Electr. Eng., Georgia Inst. of Technol., Atlanta, GA Allen, M.G. vol. 45, Issue: 6, on pp. 866-876.*
"Thin film cloth-structured inductor for magnetic integrated circuit" Shirakawa, K.; Yamaguchi, K.; Hirata, a.; Yamaoka, T. Magnetics Conference, 1990. 1990 Digests of INTERMAG '90. International Digital Object Identifier: 10.1109/INTMAG.1990.734718 Publication Year: 1990 , pp. ER-09-ER-09.*
PCT International Search Report for PCT/US2011/049903.
PCT Written Opinion of the International Searching Authority for PCT/US2011/049903.
Chong H. Ahn, et al., "A Comparison of Two Micromachined Inductors (Bar- and Meander-Type) for Fully Integrated Boost DC/DC Power Converters", IEEE Transactions on Power Electronics, vol. 11, No. 2, Mar. 1996, pp. 239-245.

* cited by examiner

*Primary Examiner* — Marcos D. Pizarro
*Assistant Examiner* — Cesar Lopez
(74) *Attorney, Agent, or Firm* — Eugene C. Conser; Wade J. Brady, III; Frederick J. Telecky, Jr.

(57) ABSTRACT

The inductance of an inductor is increased by forming a conductive wire to have a serpentine shape that weaves through a ferromagnetic core that has a number of segments that are connected together in a serpentine shape where each segment of the ferromagnetic core also has a number of sections that are connected together in a serpentine shape.

10 Claims, 24 Drawing Sheets

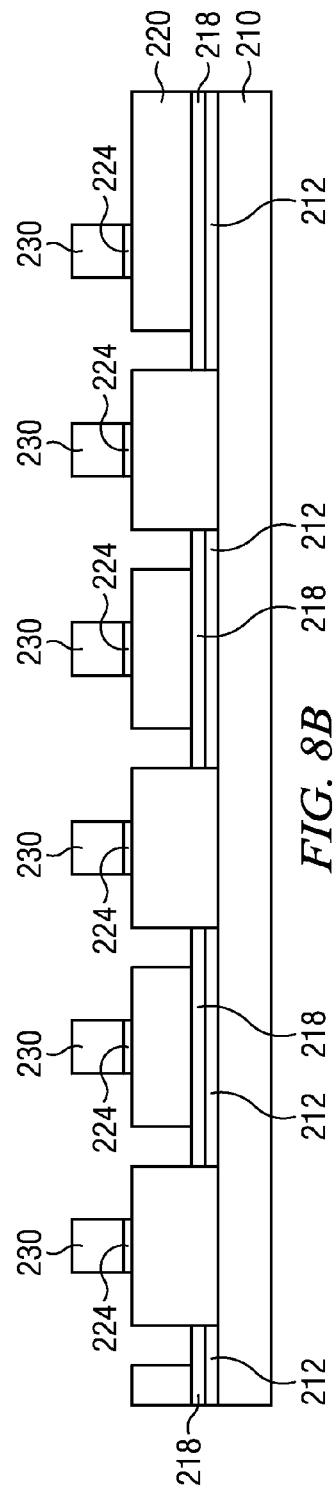
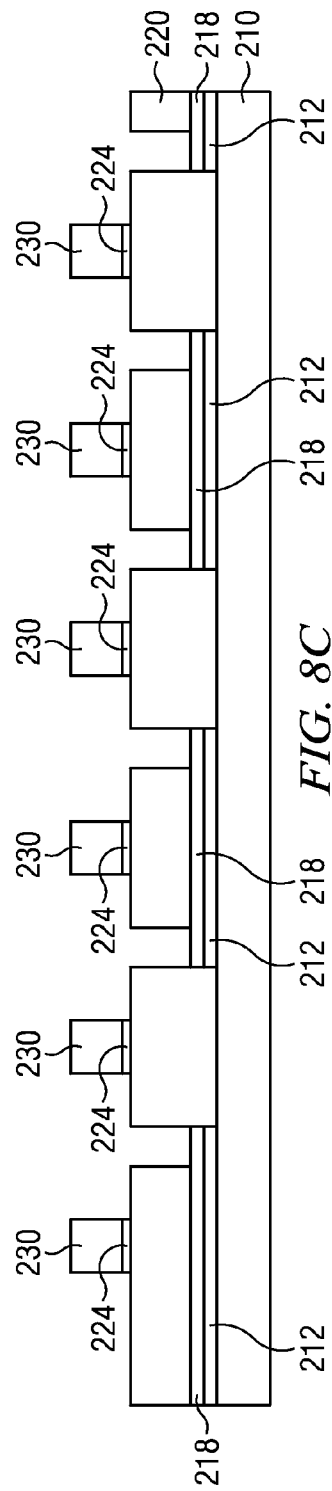
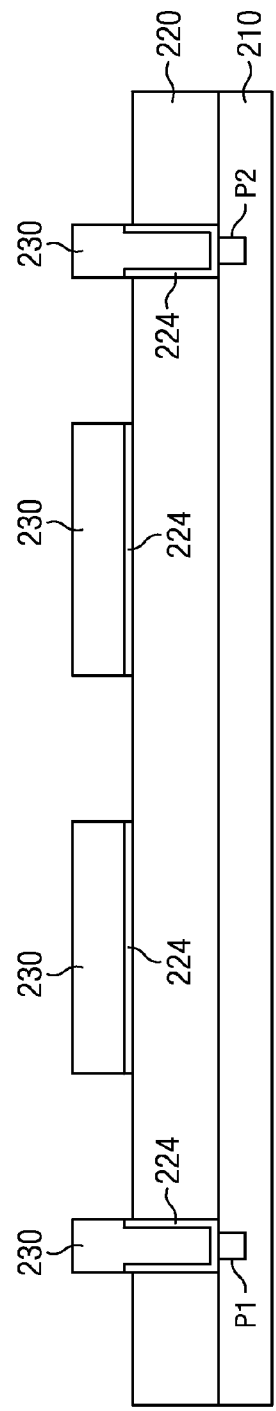
FIG. 8B
FIG. 8C
FIG. 8D

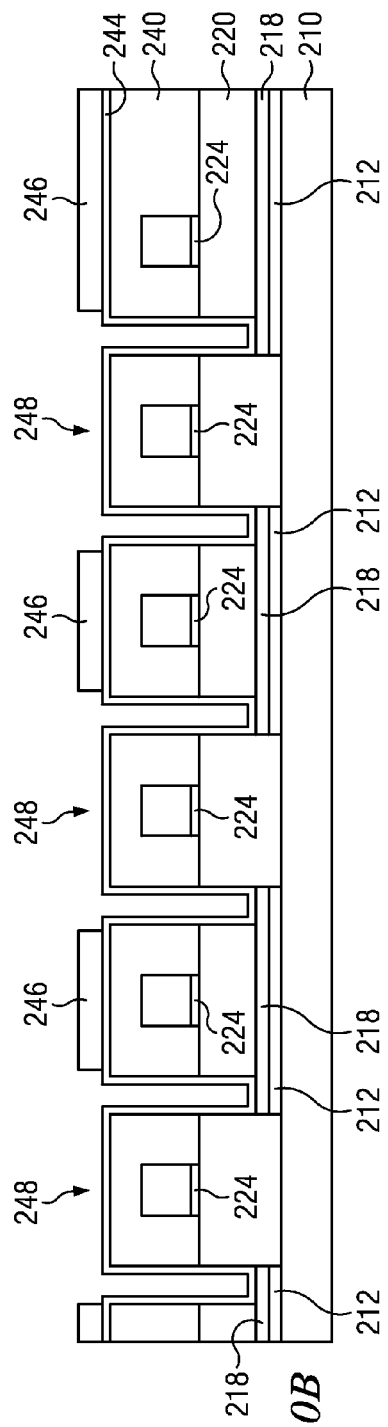
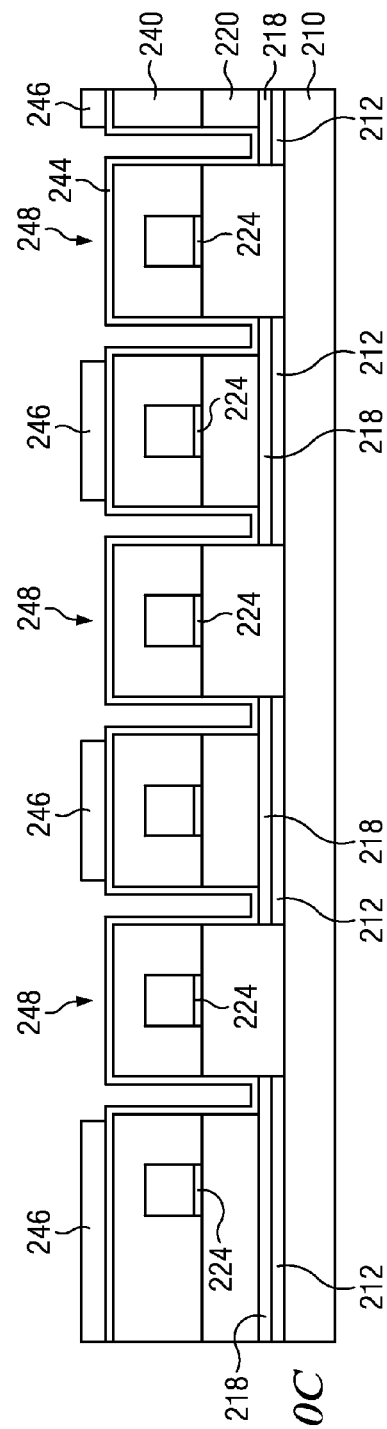
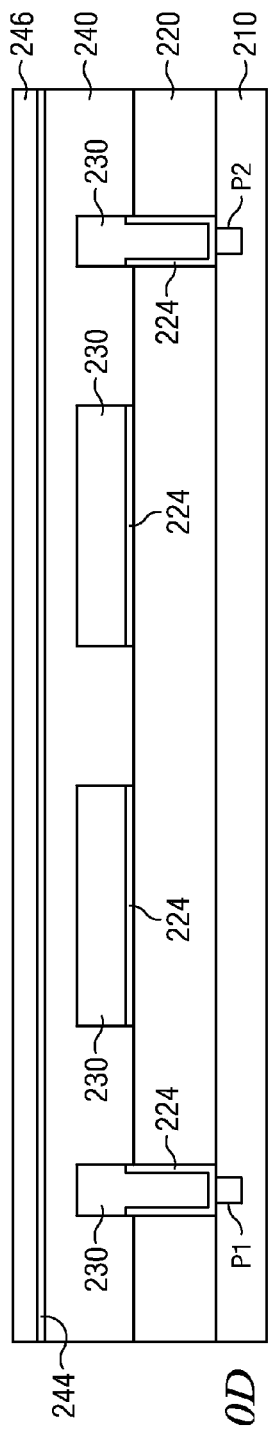
FIG. 10B
FIG. 10C
FIG. 10D

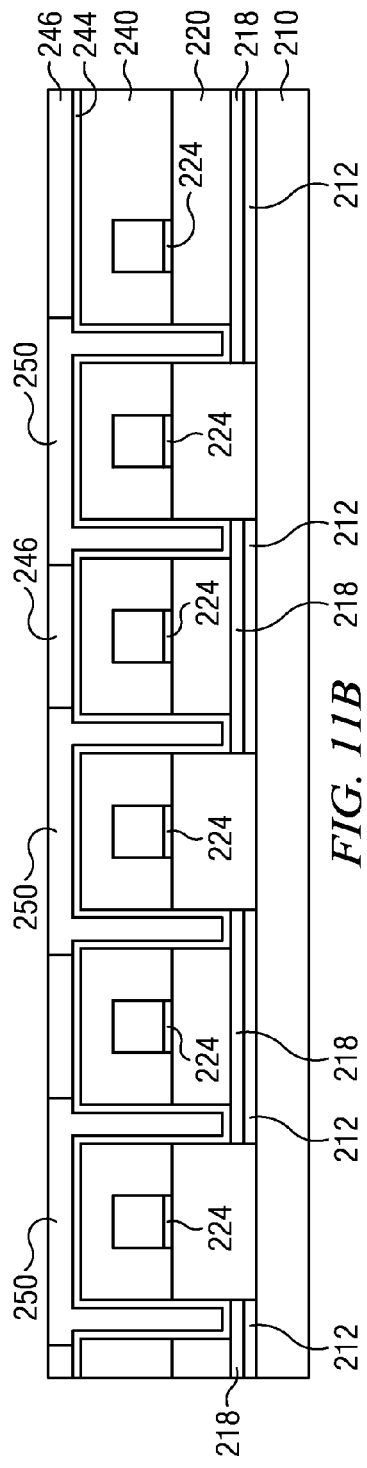
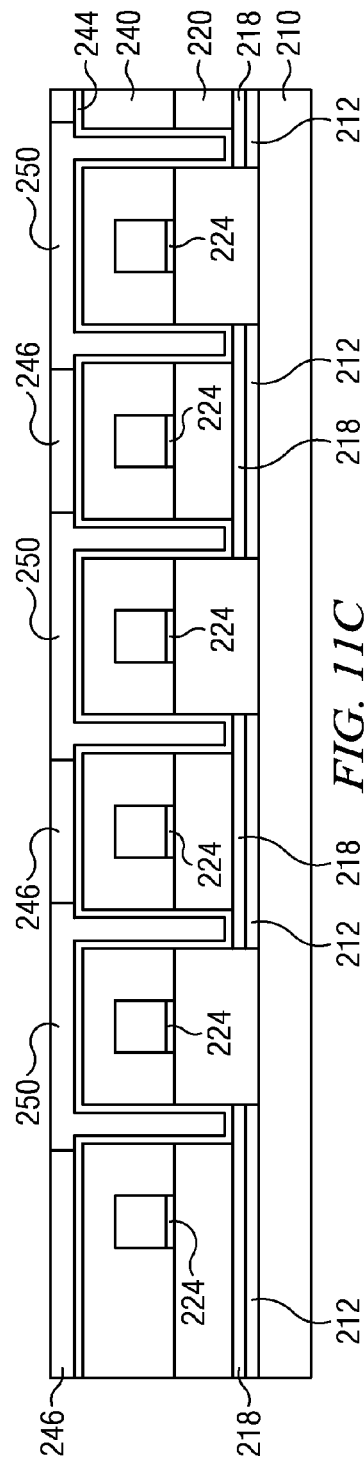
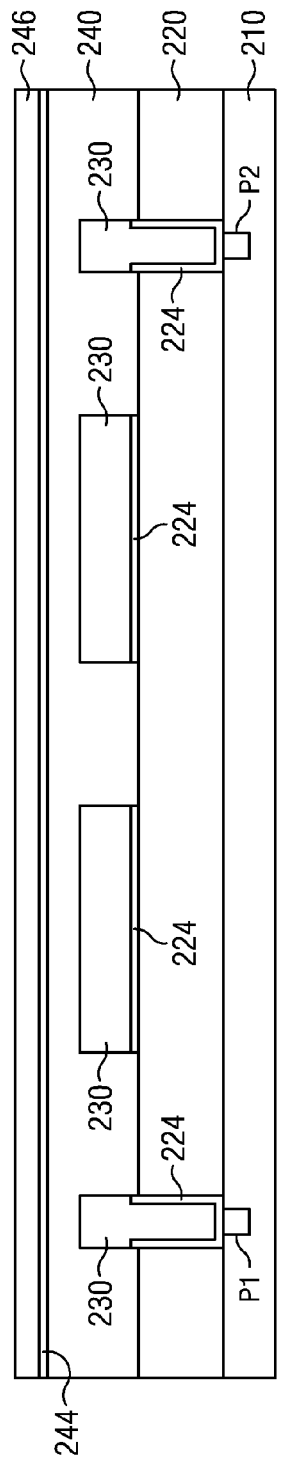
FIG. 11B
FIG. 11C
FIG. 11D

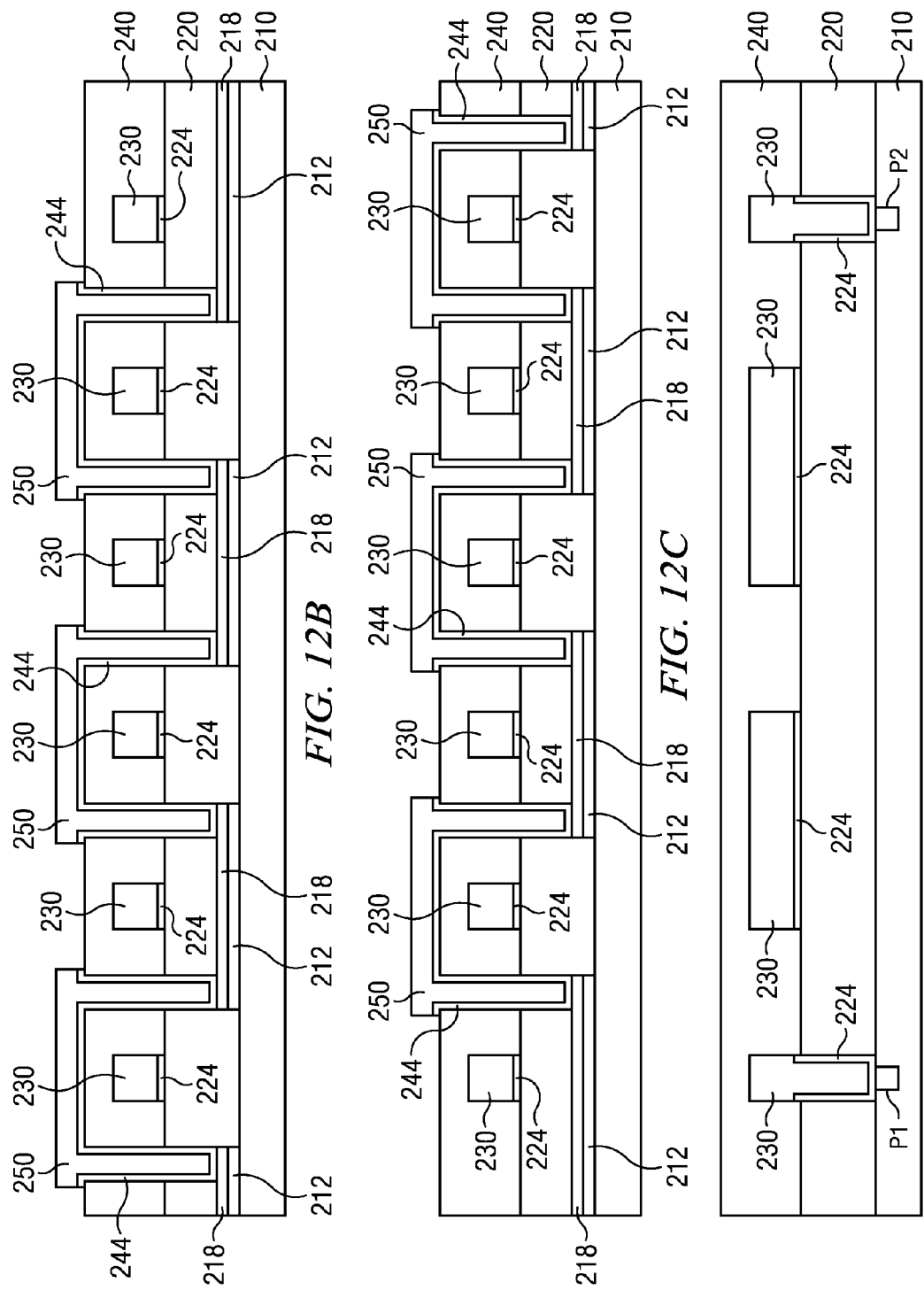

US 8,338,913 B2

SEMICONDUCTOR INDUCTOR WITH A SERPENTINE SHAPED CONDUCTIVE WIRE INTERLACED WITH A SERPENTINE SHAPED FERROMAGNETIC CORE

BACKGROUND OF THE INVENTION

1. Field of the Invention

The present invention relates to inductors and, more particularly, to an inductor with a serpentine-shaped conductive wire and a serpentine-shaped ferromagnetic core and a method of forming the semiconductor inductor.

2. Description of the Related Art

Inductors are common circuit elements that are used in numerous devices to store electromagnetic energy. Inductors typically use a ferromagnetic material, known as a core, to increase the inductance and the amount of stored energy. In many applications, inductors are implemented as stand-alone devices which, in turn, consume a significant amount of circuit board space. In order to minimize the required circuit board space for hand-held devices, it is desirable to form a semiconductor inductor that is integrated onto a chip. Although many techniques exist in the prior art for forming semiconductor inductors, there is a need for additional methods of forming semiconductor inductors.

BRIEF DESCRIPTION OF THE DRAWINGS

FIG. 1A is a plan view of inductor 100. FIG. 1B is a cross-sectional view taken along line 1B-1B of FIG. 1A. FIG. 1C is a cross-sectional view taken along line 1C-1C of FIG. 1A.

FIGS. 2A-2D through 12A-12D are a series of views illustrating an example of a method of forming an inductor 200 in accordance with the present invention. FIGS. 2A-12A are a series of plan views. FIGS. 2B-12B are a series of cross-sectional views taken along lines 2B-20B, respectively, in FIGS. 2A-12A. FIGS. 2C-12C are a series of cross-sectional views taken along lines 2C-12C, respectively, in FIGS. 2A-12A. FIGS. 2D-12D are a series of cross-sectional views taken along lines 2D-12D, respectively, in FIGS. 2A-12A.

DETAILED DESCRIPTION OF THE INVENTION

Figure 1A:
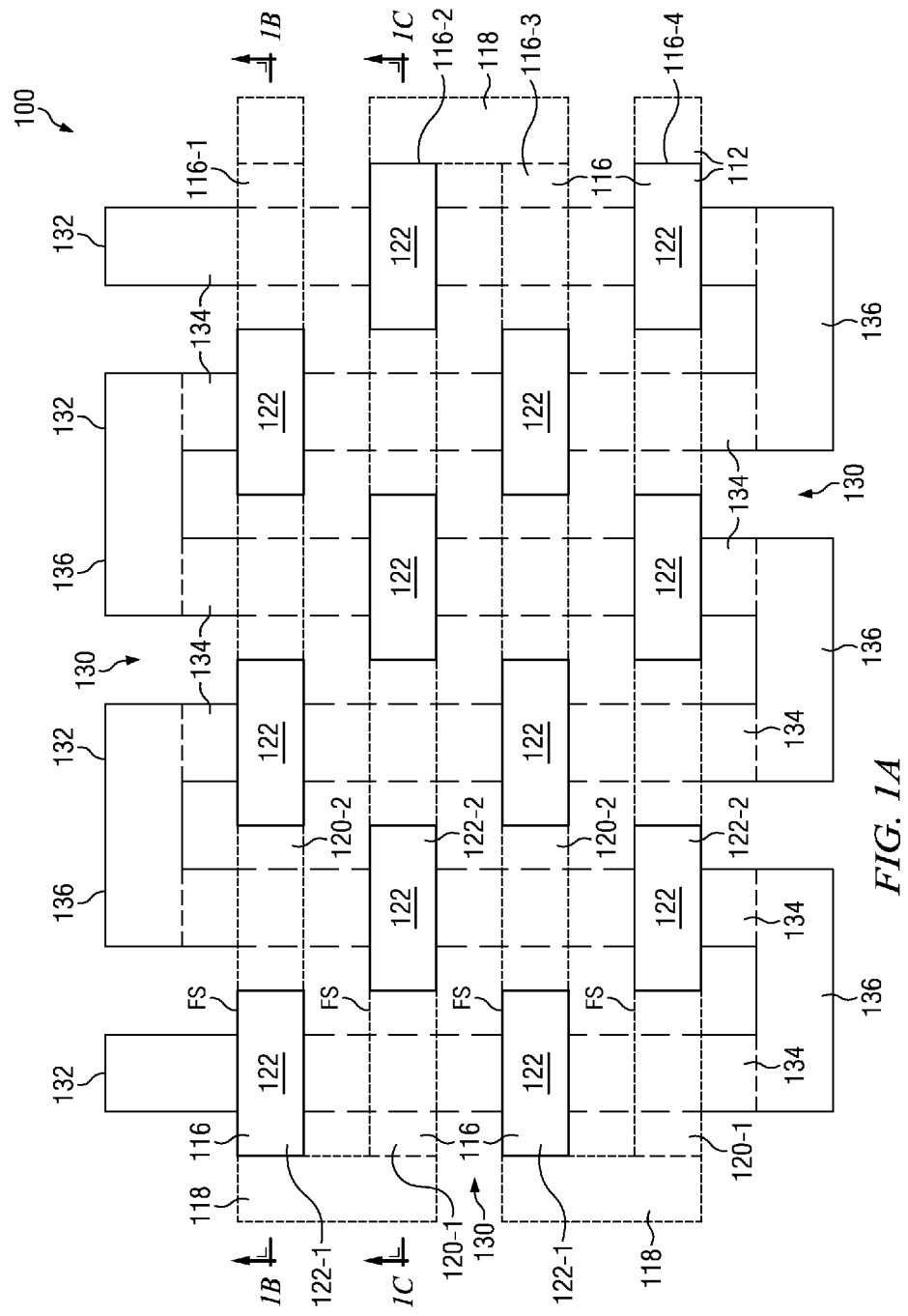
FIGS. 1A-1C are views illustrating an inductor 100 in accordance with the present invention.
Figure 1B:
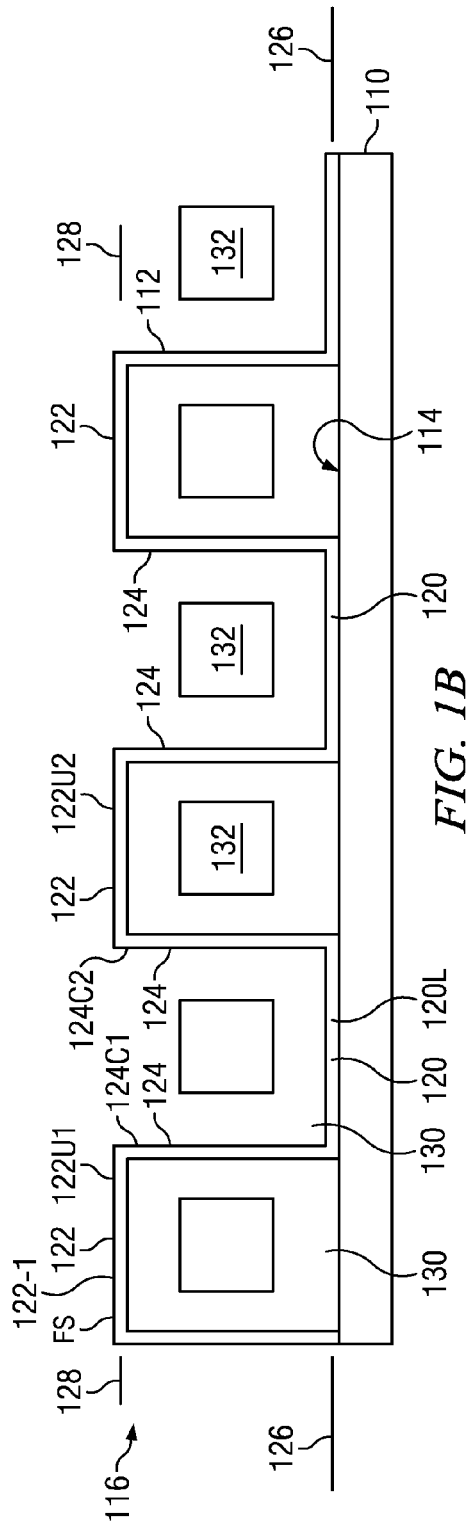
Figure 1C:
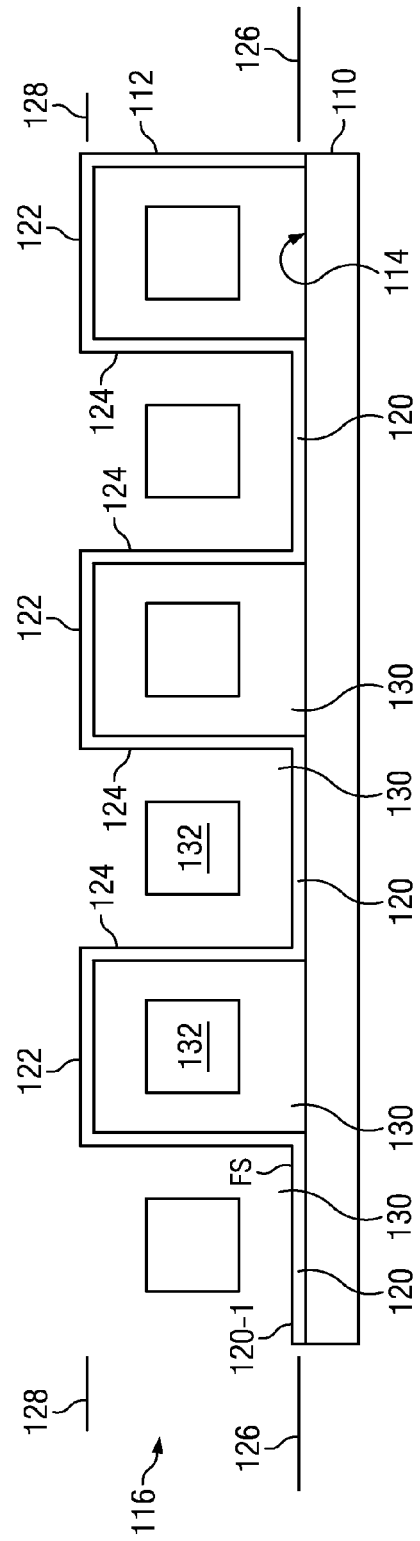
Figure 2A:
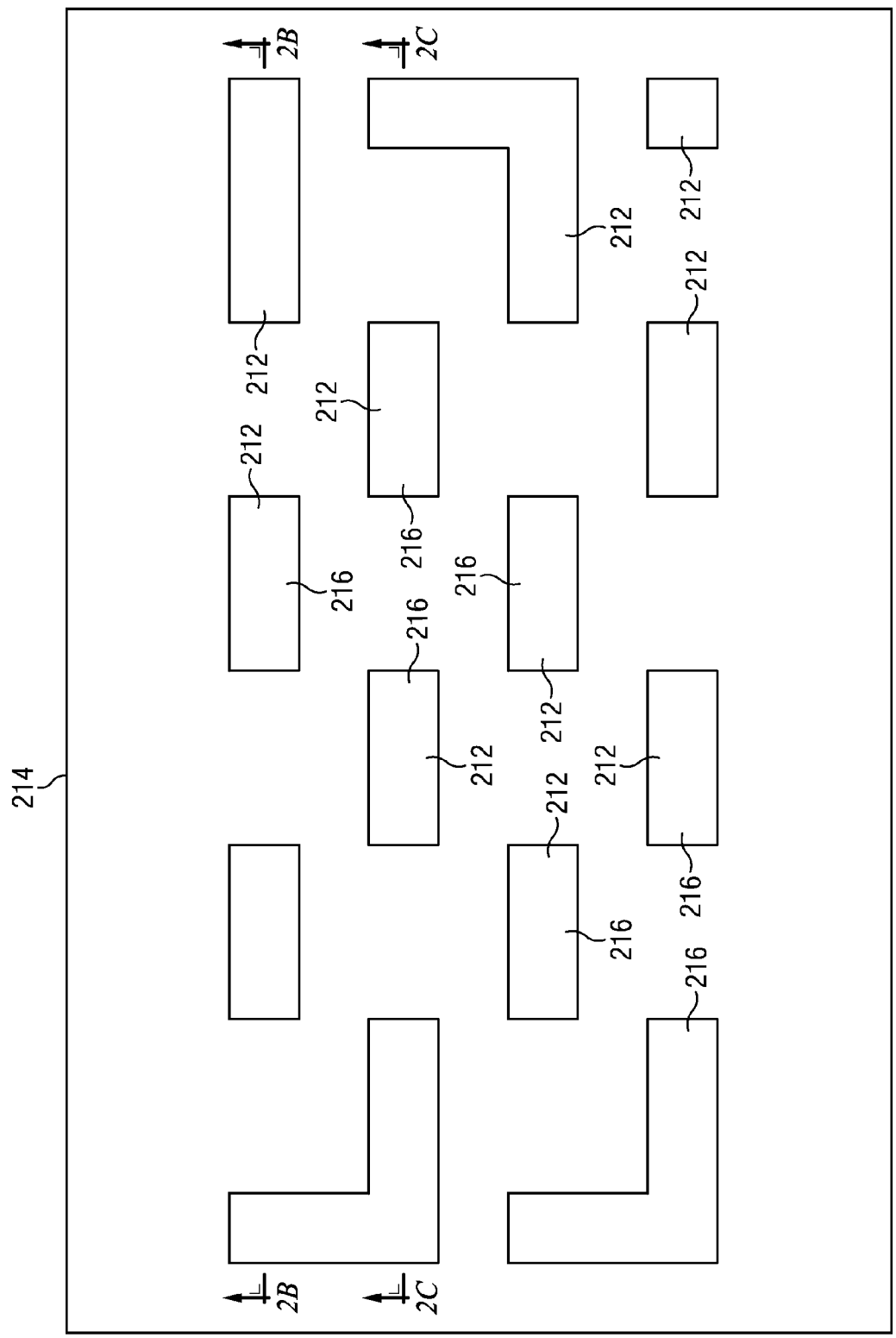
Figure 2B:
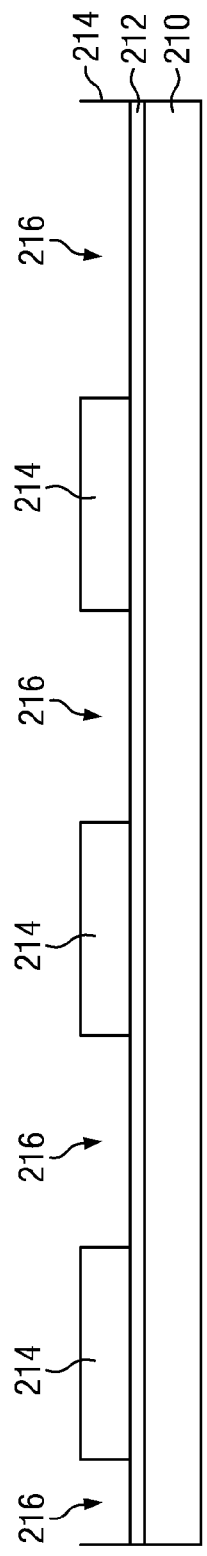
Figure 2C:
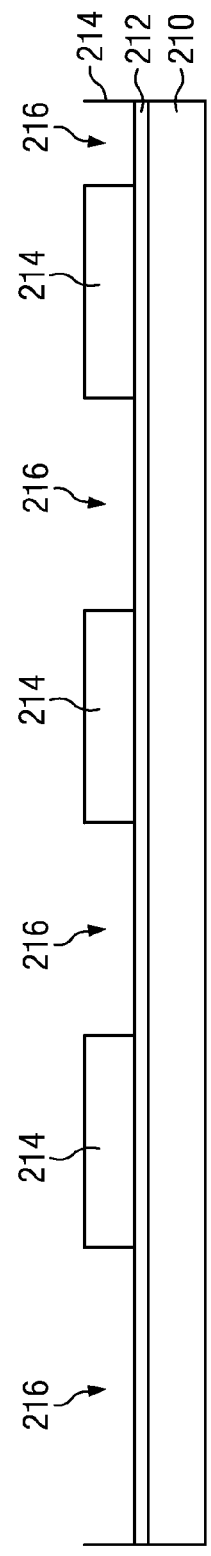
Figure 2D:
Figure 3A:
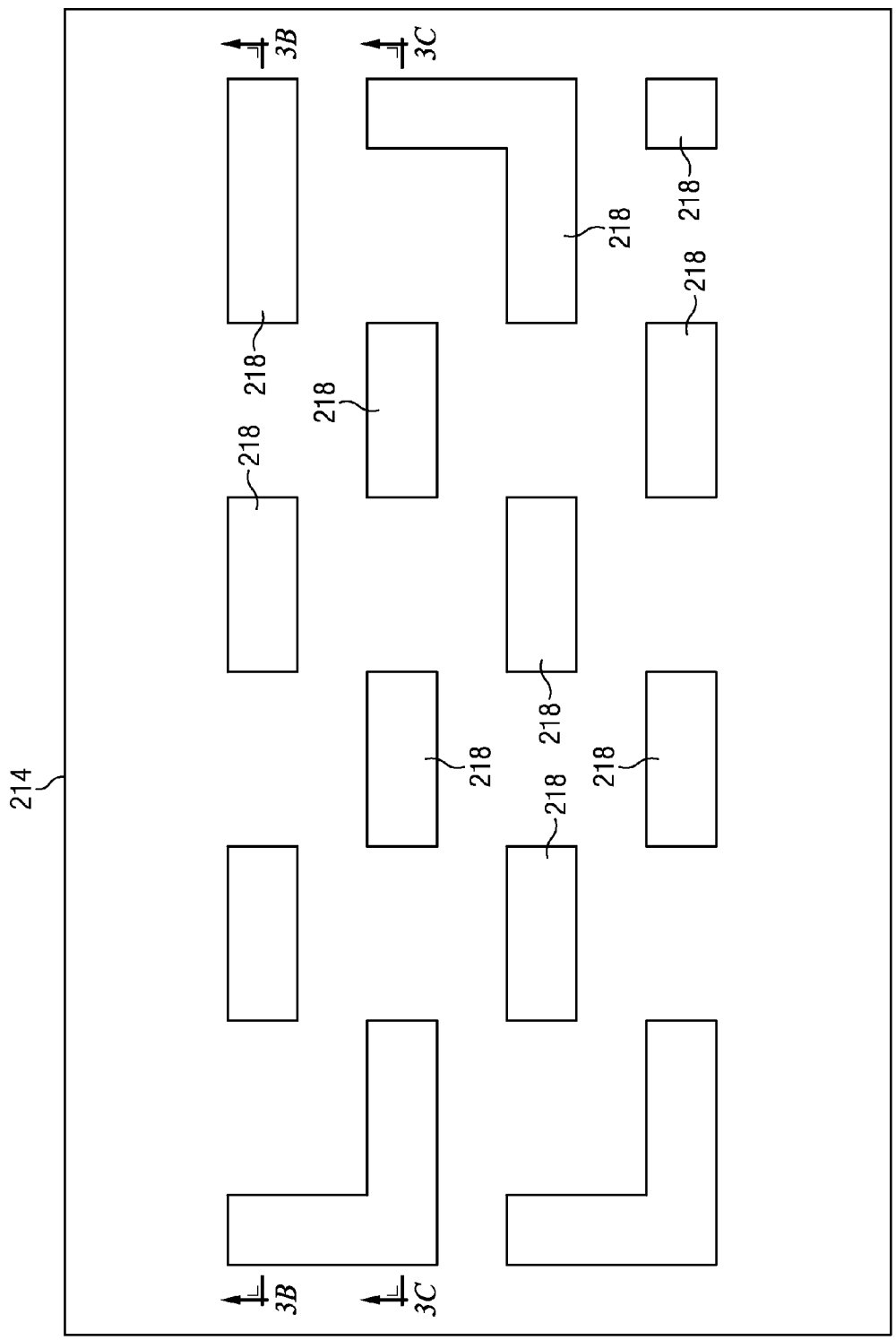
Figure 3B:
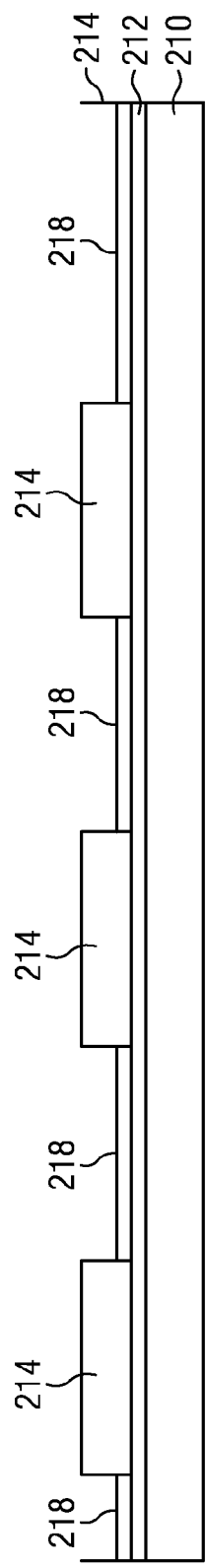
Figure 3C:
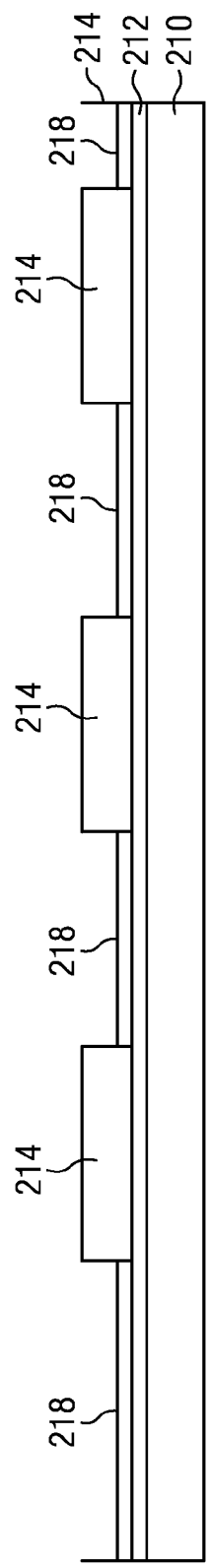
Figure 3D:
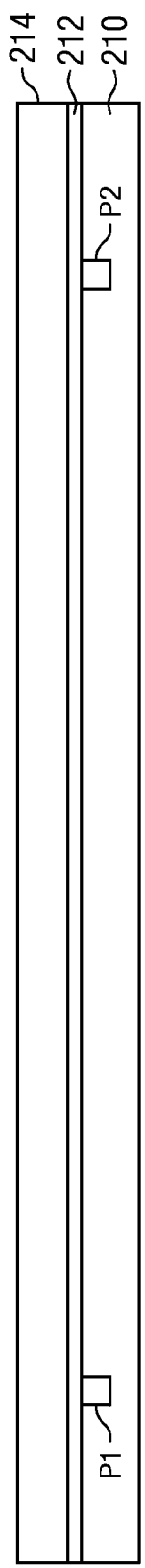
Figure 4A:
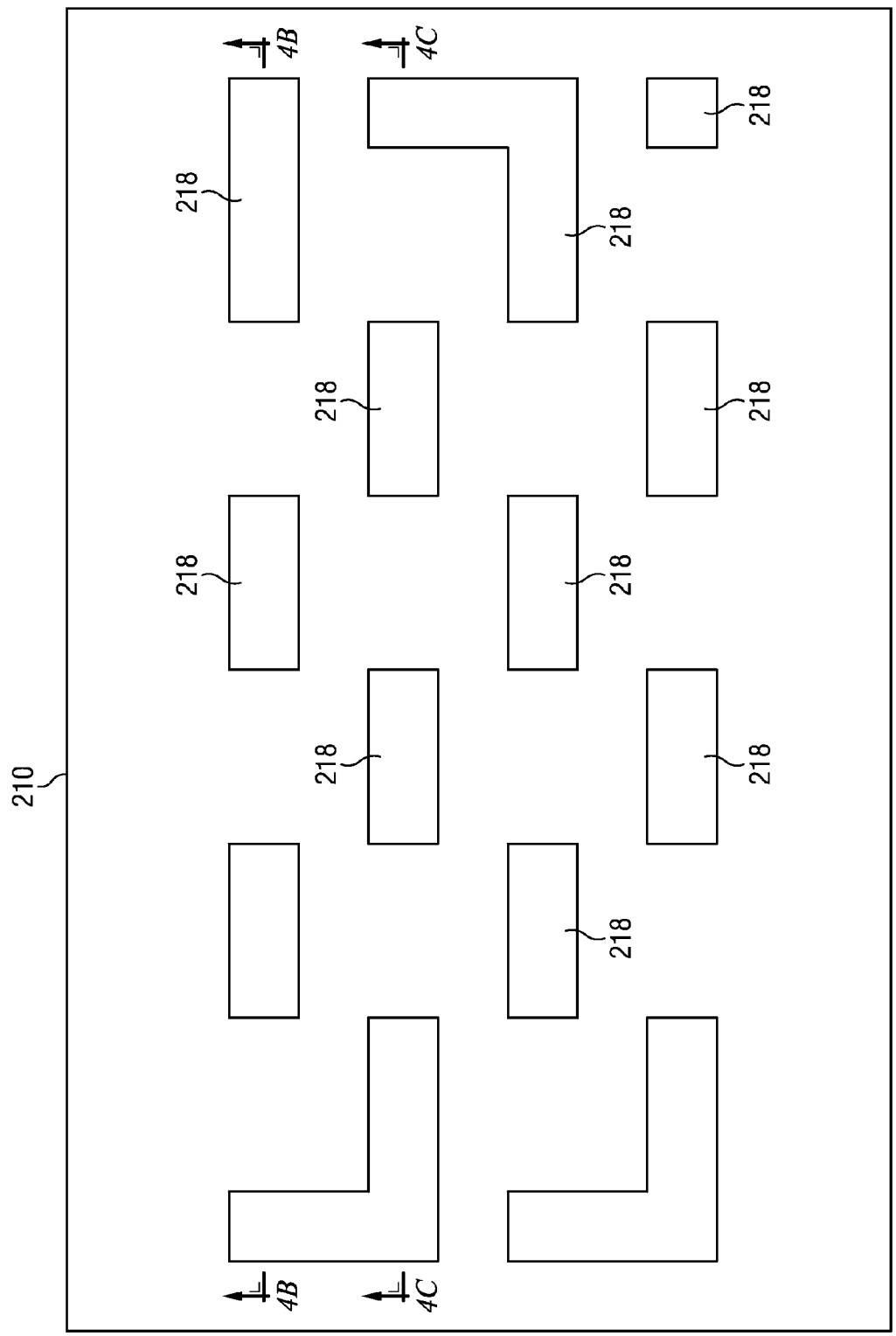
Figure 4B:
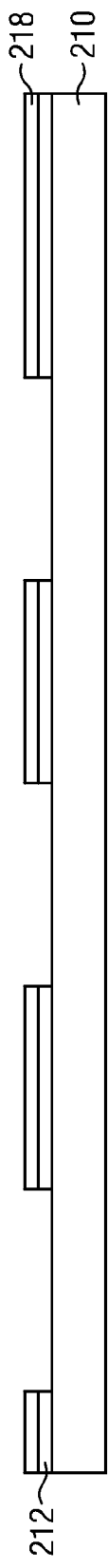
Figure 4C:
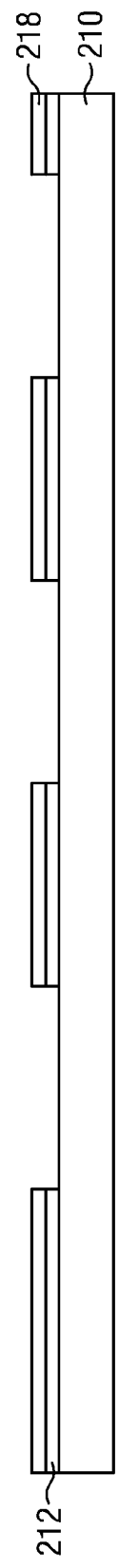
Figure 4D:
Figure 5A:
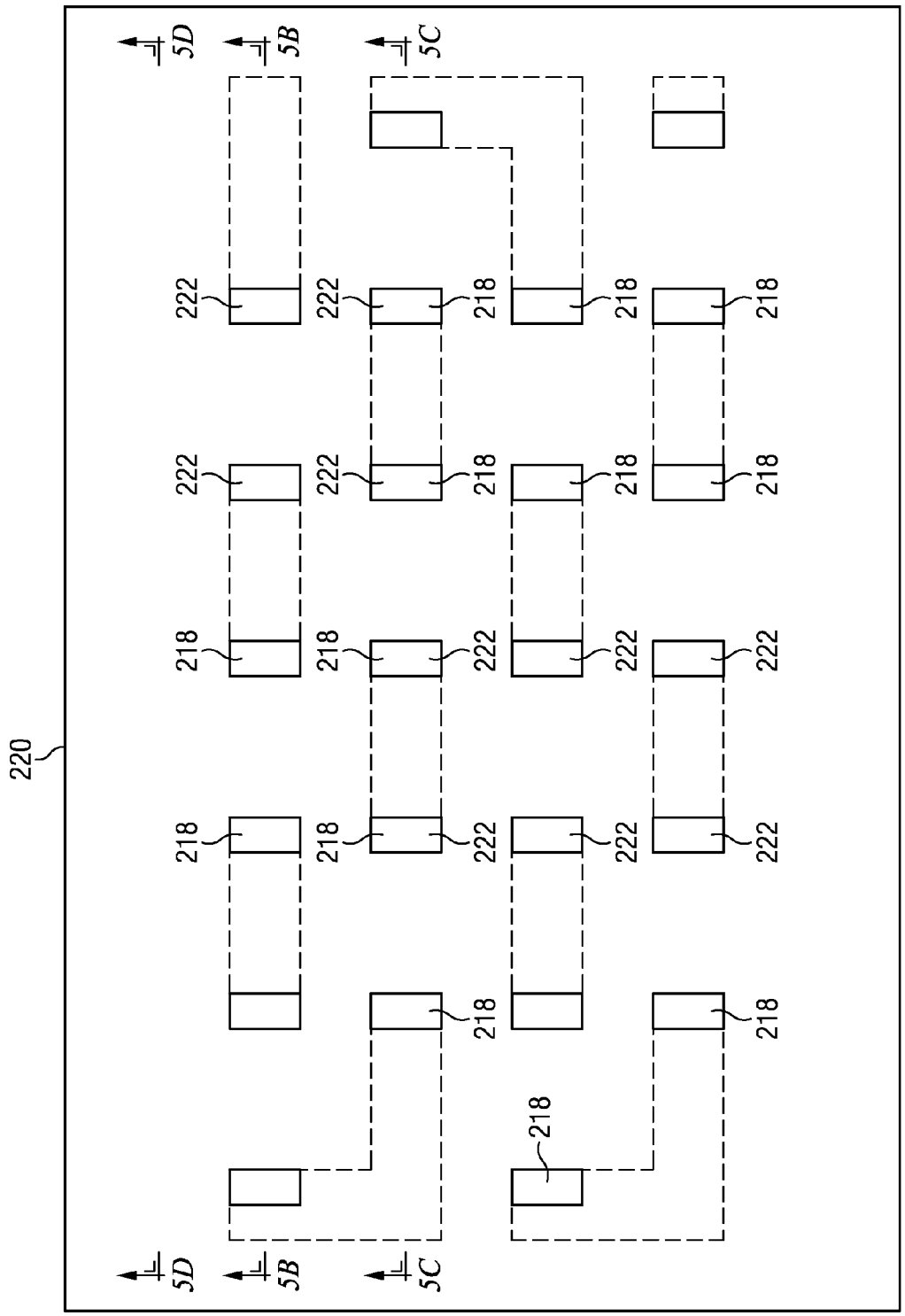
Figure 5B:
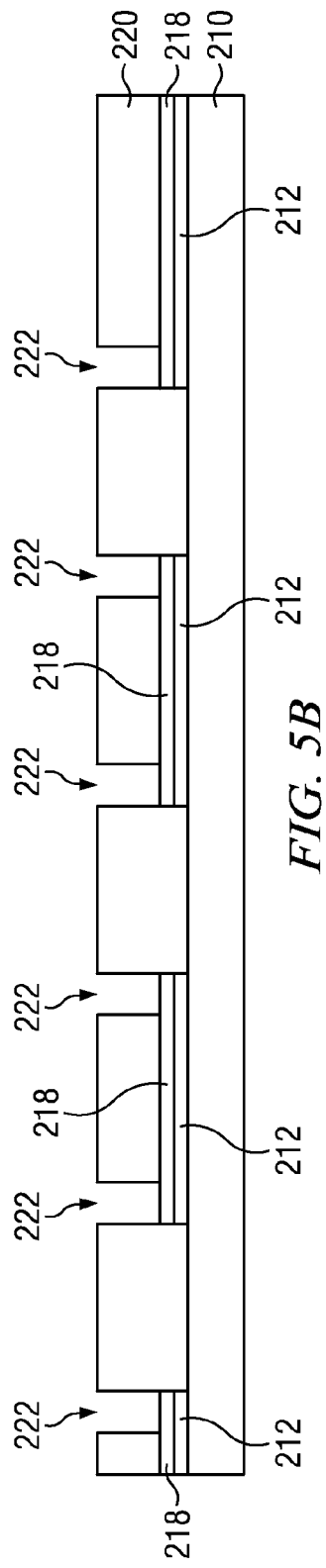
Figure 5C:
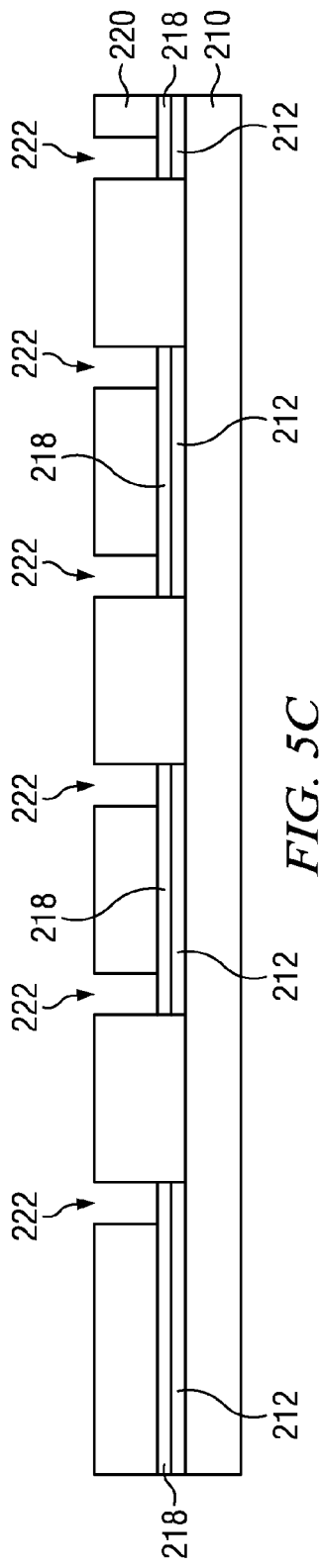
Figure 5D:
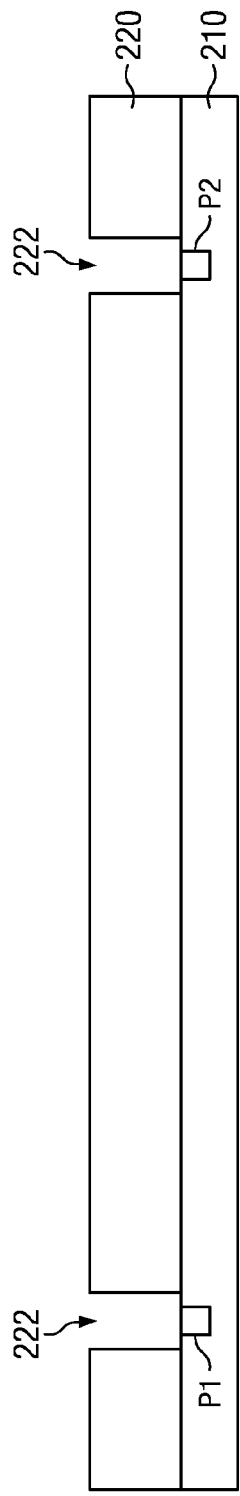
Figure 6A:
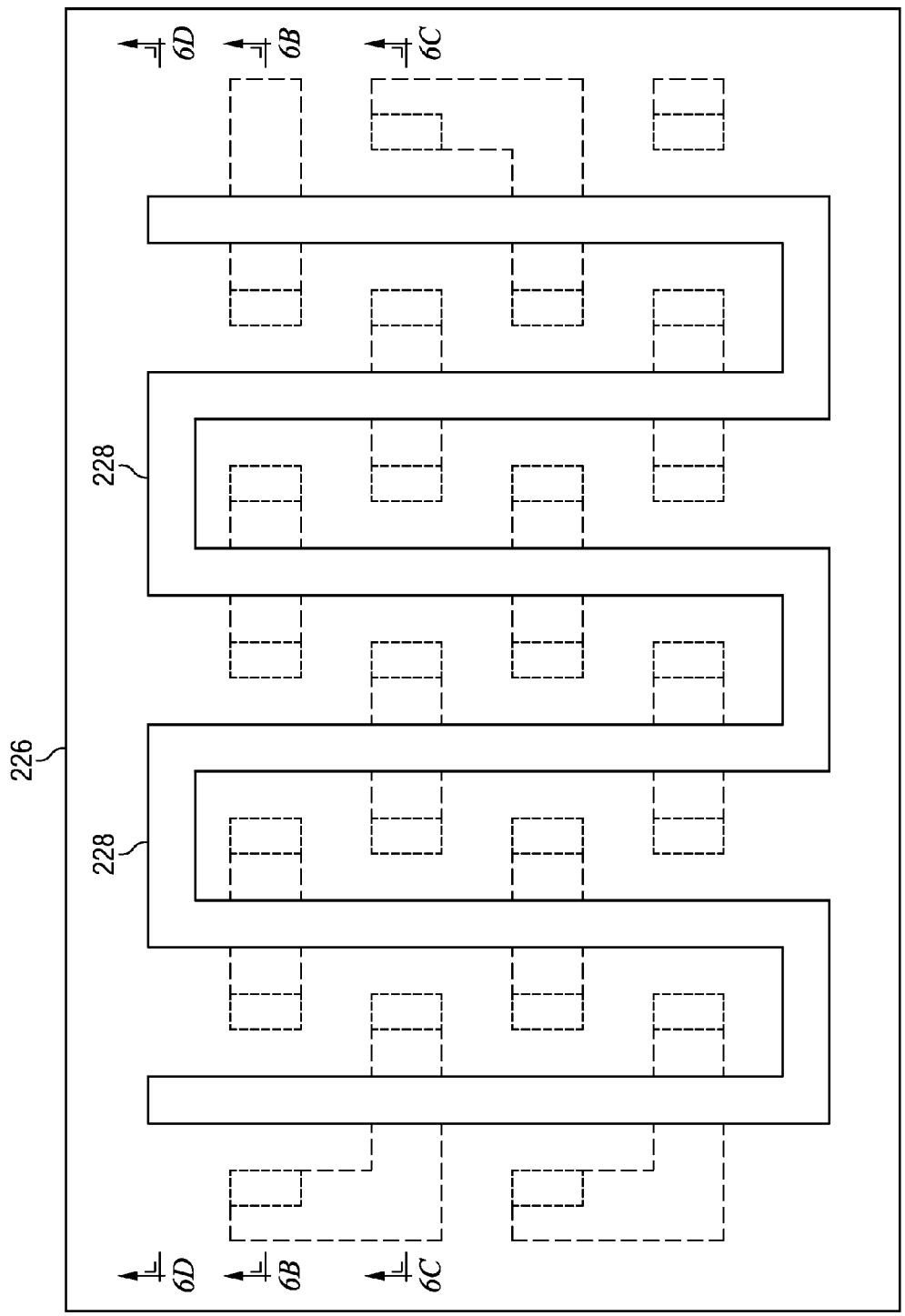
Figure 6B:
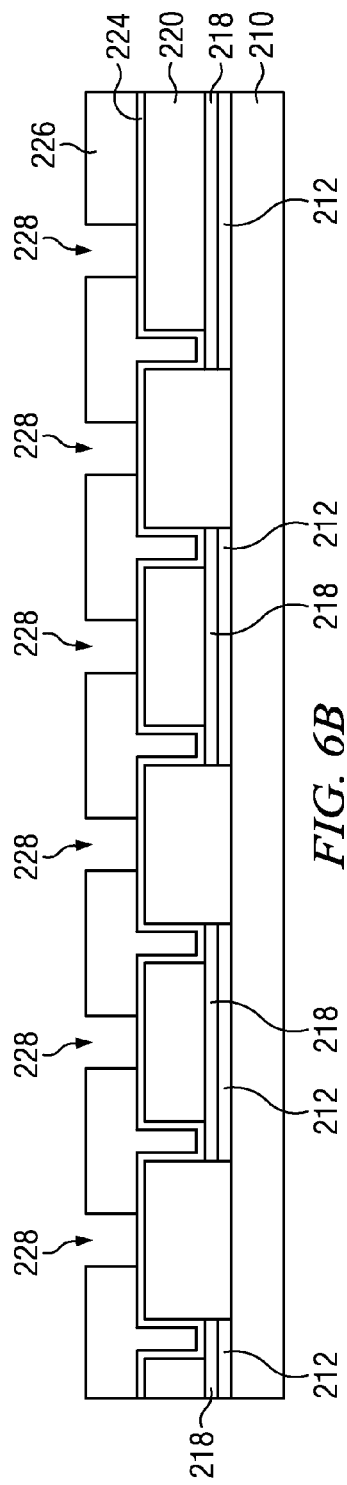
Figure 6C:
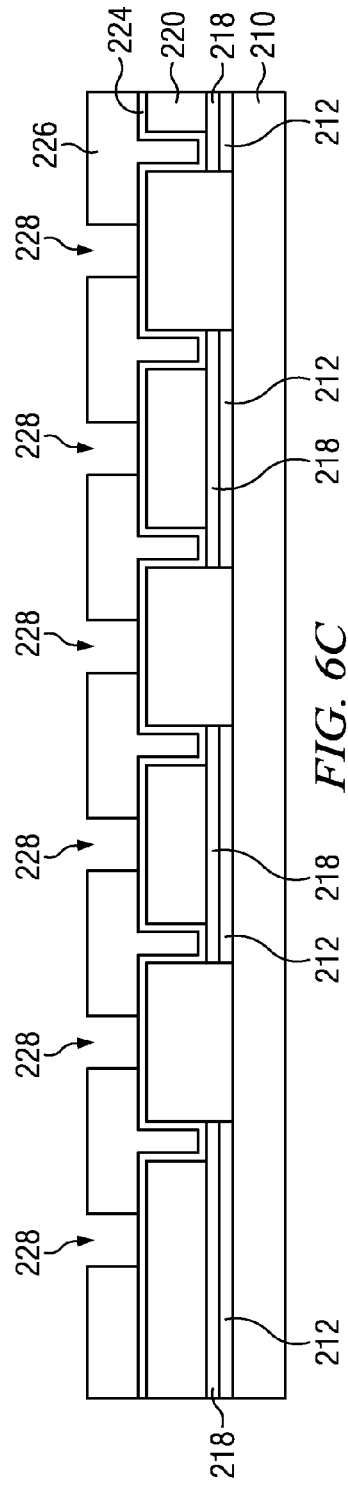
Figure 6D:
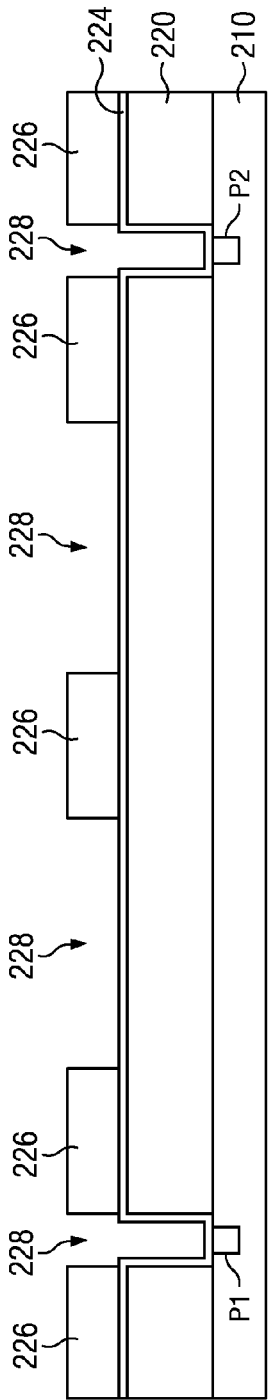
Figure 7A:
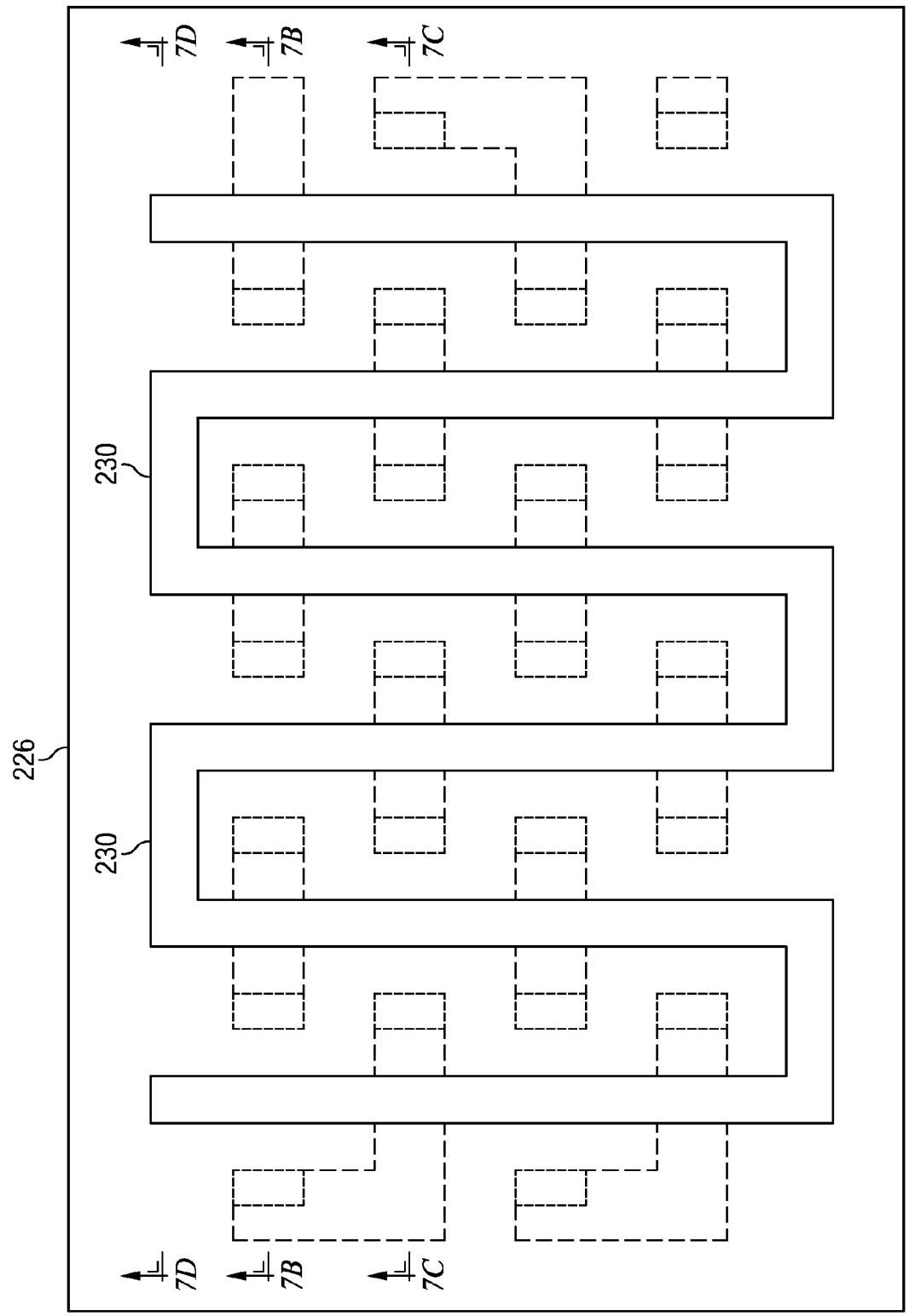
Figure 7B:
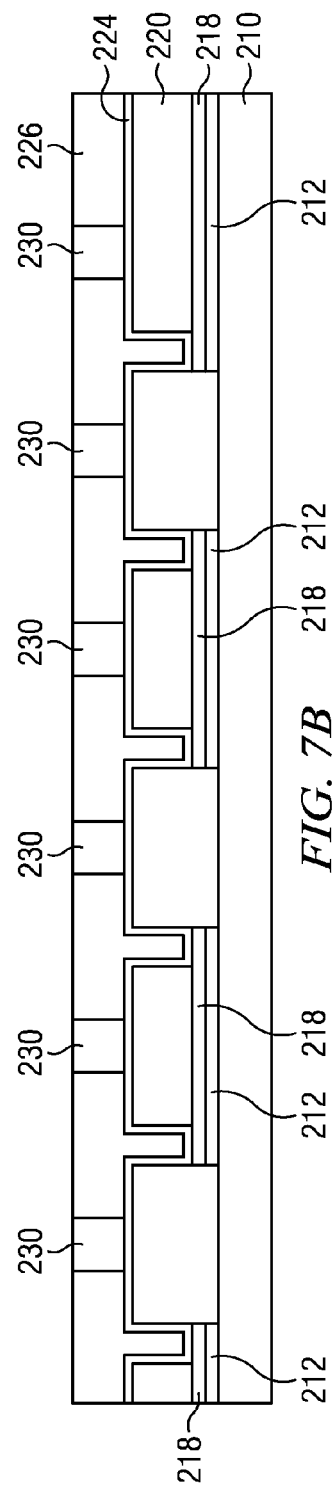
Figure 7C:
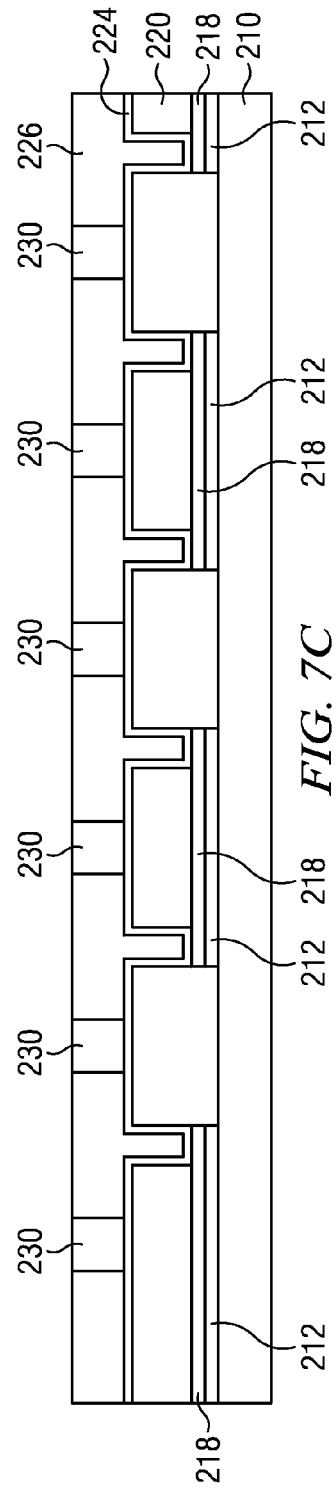
Figure 7D:
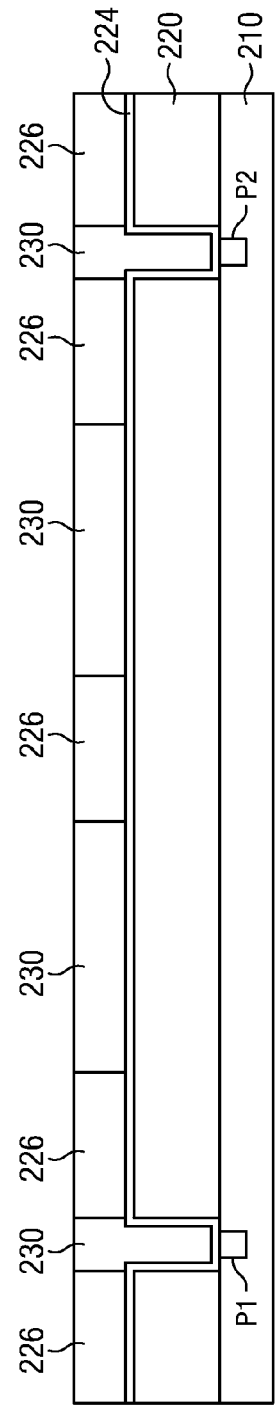
Figure 8A:
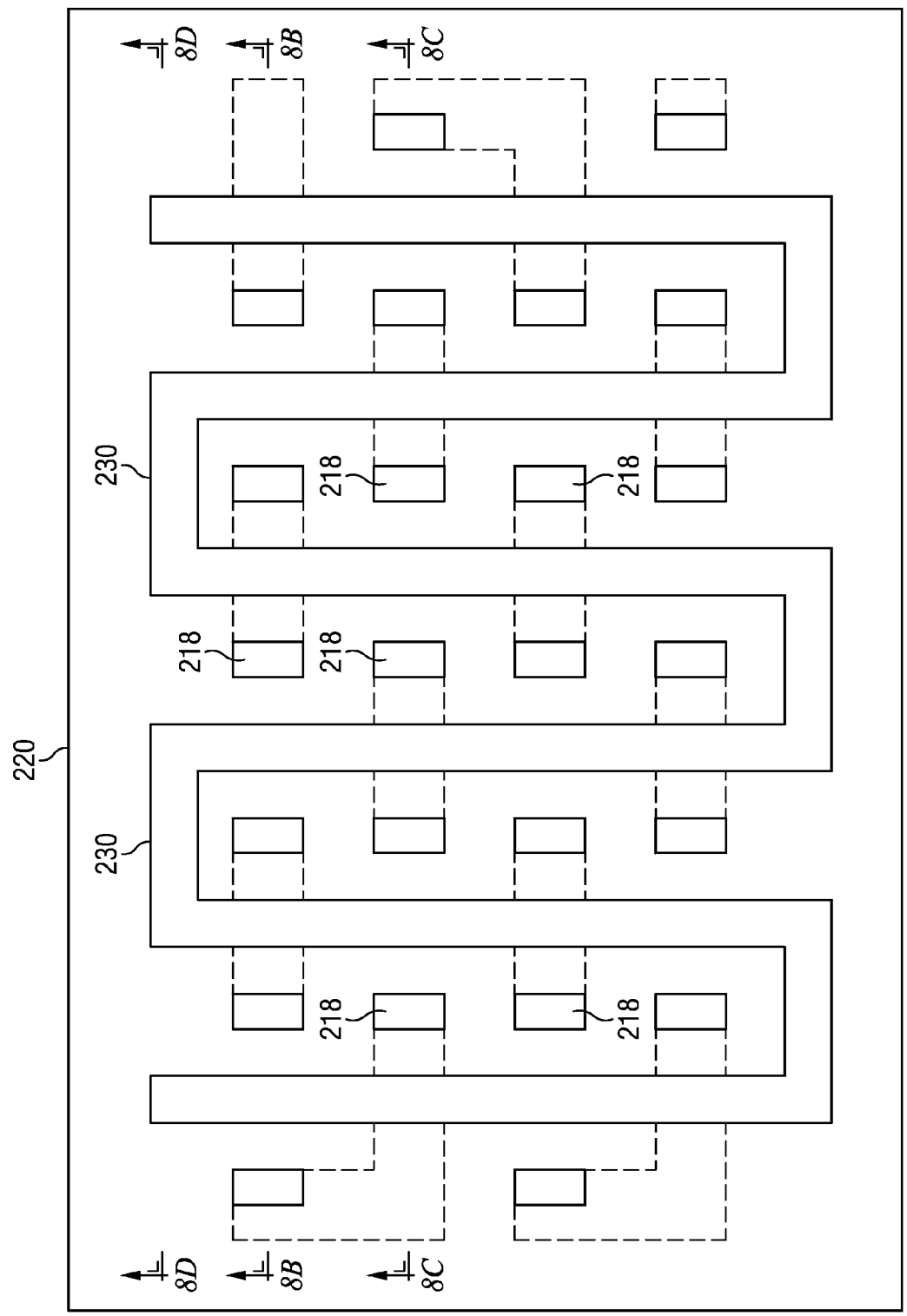
Figure 9A:
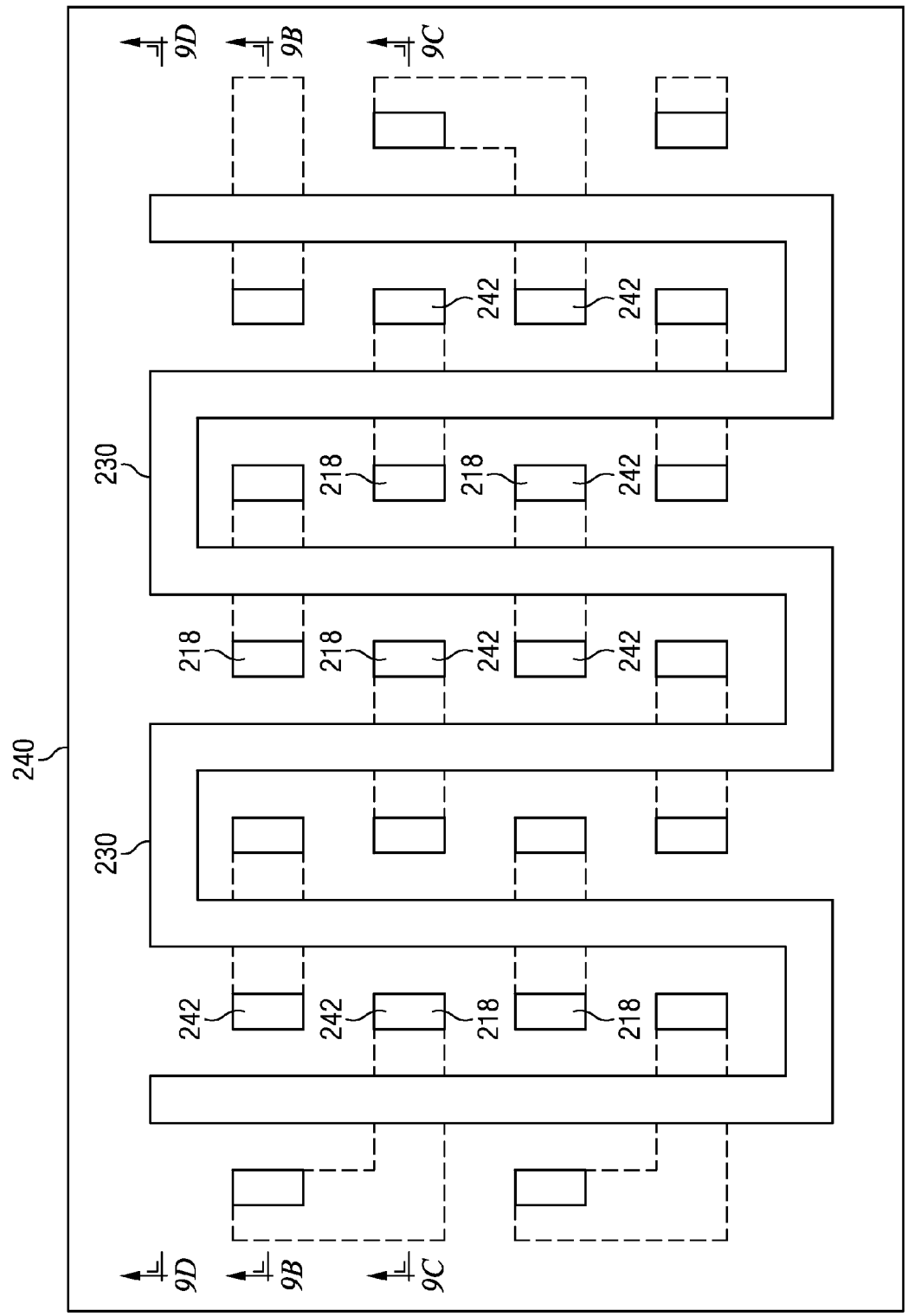
Figure 9B:
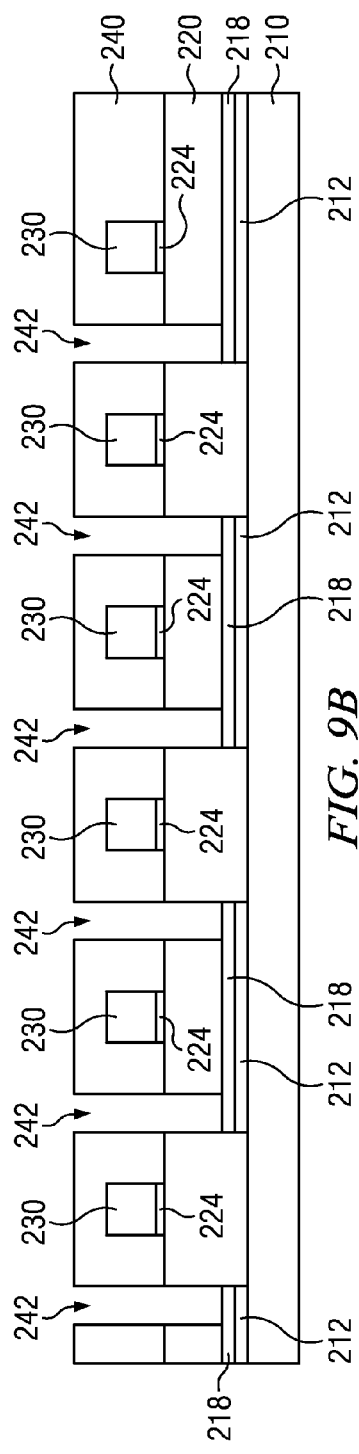
Figure 9C:
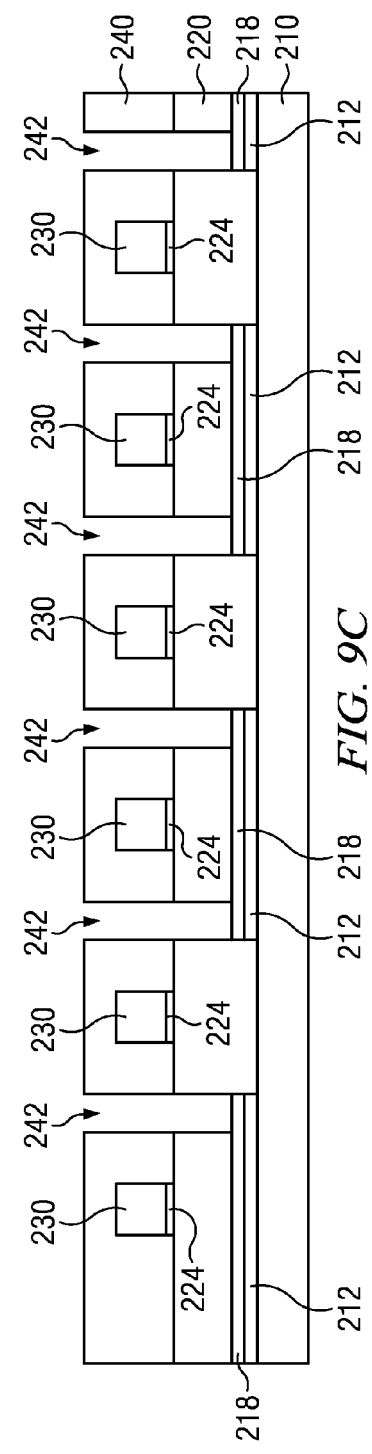
Figure 9D:
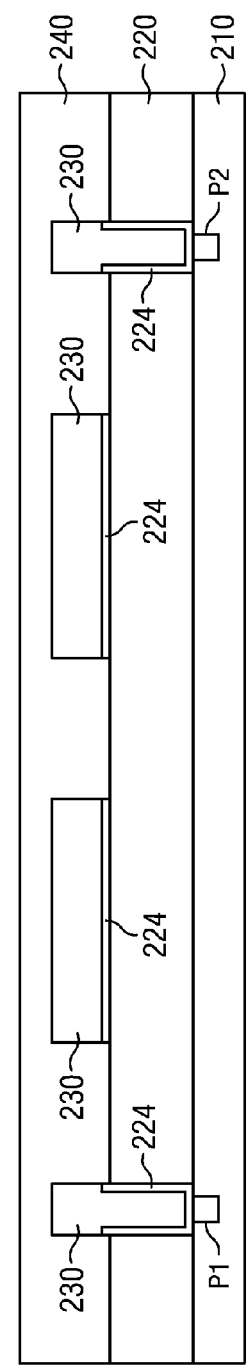
Figure 10A:
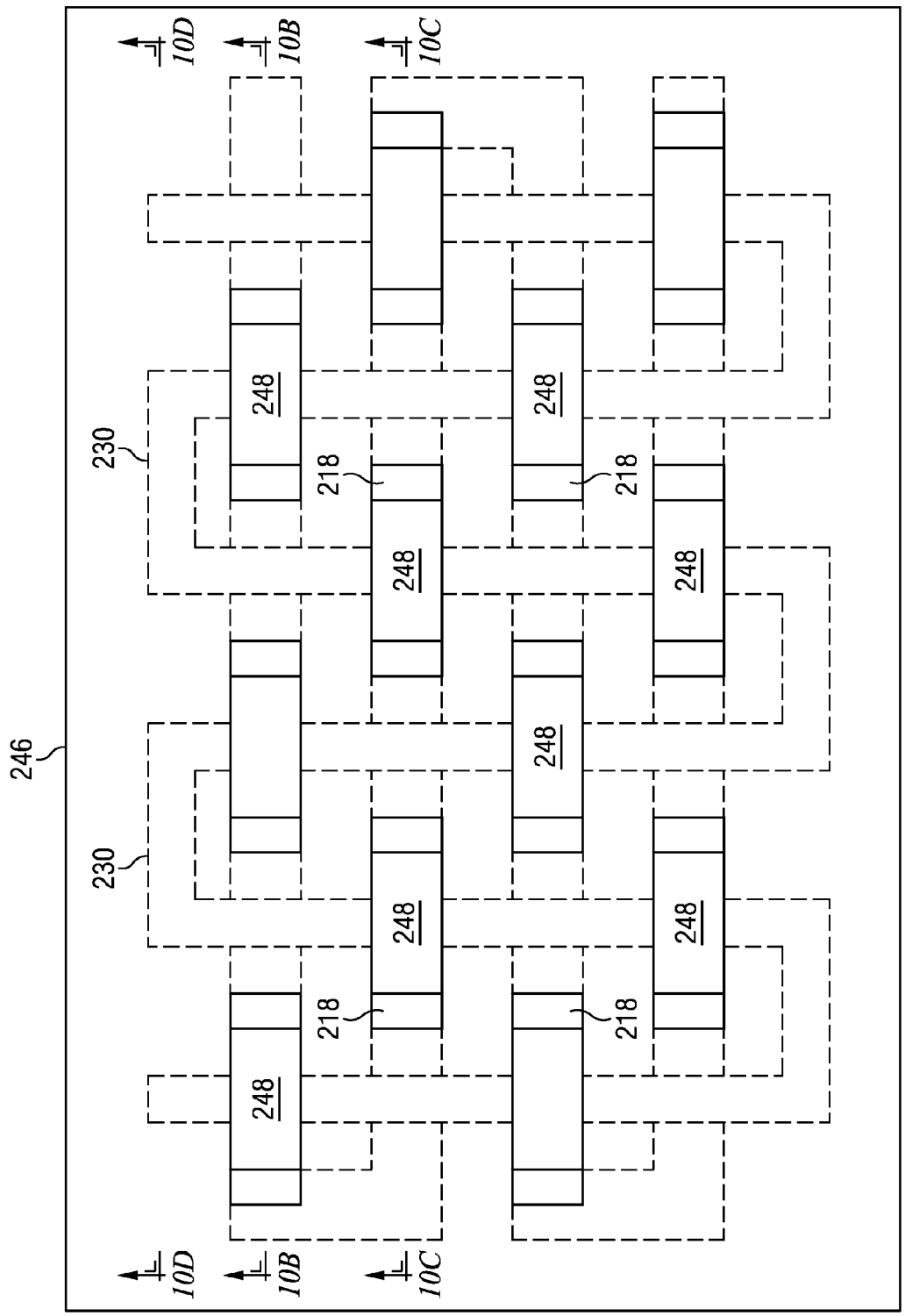
Figure 11A:
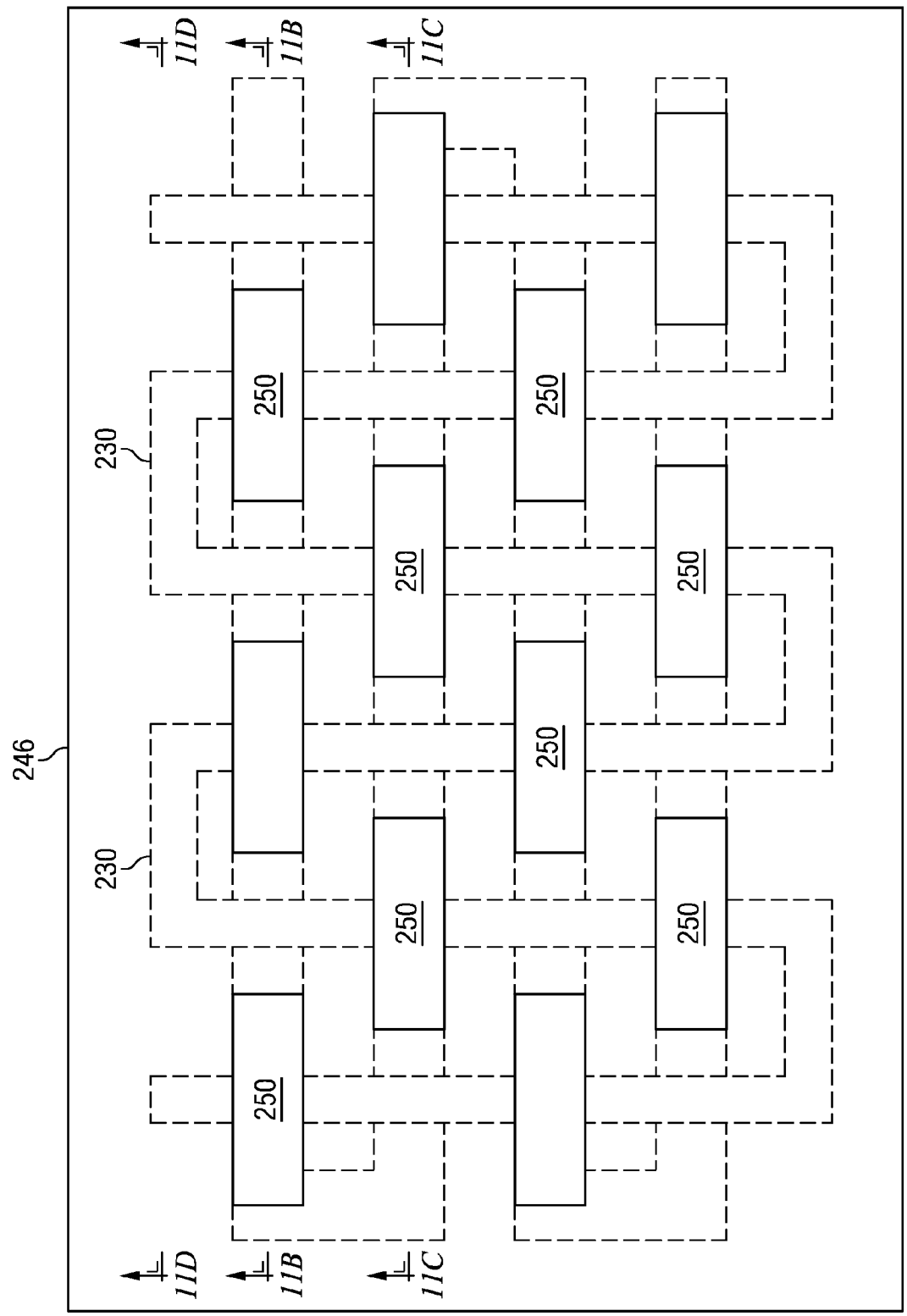
Figure 12A:
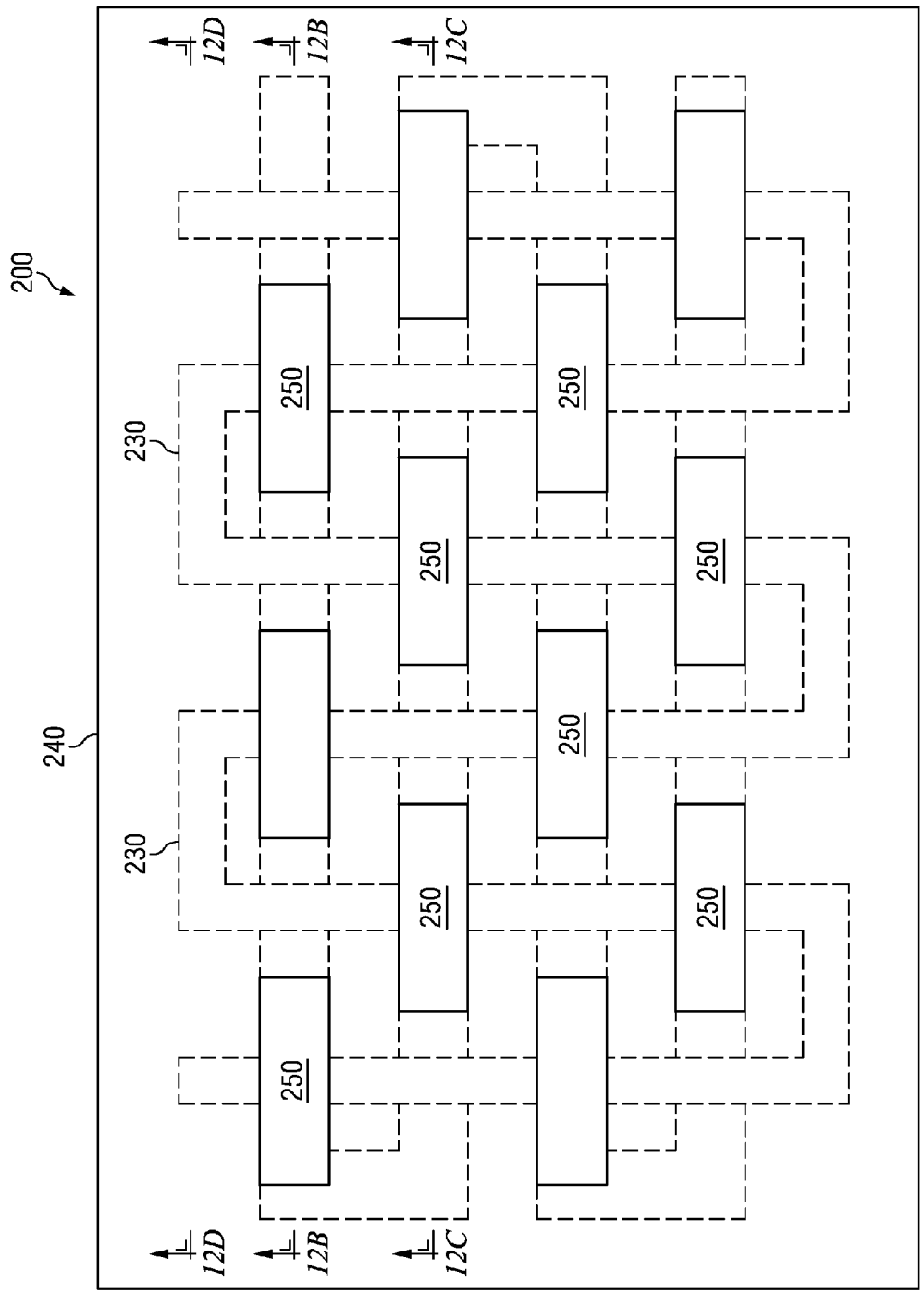

FIGS. 1A-1C show views that illustrate an inductor 100 in accordance with the present invention. FIG. 1A shows a plan view of inductor 100, while FIG. 1B shows a cross-sectional view taken along line 1B-1B of FIG. 1A, and FIG. 1C shows a cross-sectional view taken along line 1C-1C of FIG. 1A.

As described in greater detail below, the present invention increases the inductance of an inductor by utilizing a conductive wire with a serpentine shape. The conductive wire weaves through a ferromagnetic core that has a number of segments that are connected together in a serpentine shape, where each segment of the ferromagnetic core also has a number of sections that are connected together in a serpentine shape.

As shown in FIGS. 1A-1C, inductor 100 of the present invention includes a semiconductor body 110 and a ferromagnetic core 112. Semiconductor body 110 has a non-conductive top surface 114, while ferromagnetic core 112 touches the non-conductive top surface 114 of semiconductor body 110.

As further shown in FIGS. 1A-1C, ferromagnetic core 112 has a number of main segments 116 and a number of end segments 118 that are connected to the main segments 116 to form a single unified structure. The main segments 116 are spaced apart from each other and lie sideways adjacent to each other. In the present example, the main segments 116 lie substantially parallel to each other. In addition, the end segments 118 lie substantially perpendicular to the main segments 116 and are connected to the main segments 116 to form a substantially square-cornered serpentine shape.

Each main segment 116, in turn, has a number of lower sections 120, a number of upper sections 122, and a number of connecting sections 124 that are connected to the lower sections 120 and the upper sections 122. In the present example, each of the lower sections 120 lies substantially in a first plane 126, while each of the upper sections 122 lie substantially in a second plane 128 that is substantially parallel to first plane 126. Further, the connecting sections 124 lie substantially perpendicular to the lower and upper sections 120 and 122 and are connected to the lower and upper sections 120 and 122 to form a substantially square-cornered serpentine shape.

Thus, each main segment 116 has a lower section 120-L, an upper section 122-U1, an upper section 122-U2 that is spaced apart from upper section 122-U1, a connecting section 124-C1 that lies between and touches lower section 120-L and upper section 122-U1, and a connecting section 124-C2 that is spaced apart from connecting section 124-C1 and that lies between and touches lower section 120-L and upper section 122-C2.

As a result, the lower and upper sections 120 and 122 of each main segment 116 alternate back and forth between a lower section 120 that touches the non-conductive top surface 114 of semiconductor body 110, and an upper section 122 that lies a distance above the non-conductive top surface 114 of semiconductor body 110.

Further, each pair of sideways adjacent main segments 116 are staggered so that the sections alternate. Thus, for example, if a first section FS of a first main segment 116-1 is an upper section 122, then the corresponding first section FS of a second main segment 116-2 that lies sideways adjacent to the first main segment 116-1 is a lower section 120, while the corresponding first section FS of a third main segment 116-3 that lies sideways adjacent to the second main segment 116-2 is an upper section 122 and the corresponding first section FS of a fourth main segment 116-4 that lies sideways adjacent to the third main segment 116-3 is a lower section 120.

As additionally shown in FIGS. 1A-1C, inductor 100 includes a non-conductive region 130 that touches the non-conductive top surface 114 of semiconductor body 110 and ferromagnetic core 112, and a conductive wire 132 that touches non-conductive region 130. Non-conductive region 130 surrounds and isolates conductive wire 132 from ferromagnetic core 112.

Conductive wire 132, in turn, has a number of main segments 134 and a number of end segments 136 that are connected to the main segments 134 to form a single unified structure. The main segments 134 are spaced apart from each other and lie sideways adjacent to each other. In the present example, the main segments 134 lie substantially parallel to each other.

Further, the end segments 136 lie substantially perpendicular to the main segments 134 and are connected to the main segments 134 to form a substantially square-cornered serpentine shape. Thus, the shape of the inductor coil is serpentine where a pair of parallel main segment 134 connected at one end by an end segment 136 forms an equivalent of one turn of a traditional spiral or solenoid inductor.

In addition, conductive wire 132 is woven through ferromagnetic core 112 so that conductive wire 132 lies above each lower section 120 and below each upper section 122 of each main segment 116. As shown in FIGS. 1A-1C, conductive wire 132 passes under a first upper section 122-1 of first main segment 116-1.

After conductive wire 132 passes under first upper section 122-1 of first main segment 116-1, conductive wire 132 next passes over a first lower section 120-1 of second main segment 116-2 (which lies sideways adjacent to first main segment 116-1 so that no other segment lies between) before passing over any other lower section 120 of any other main segment 116, and before passing under any other upper section 122 of any other main segment 116.

After conductive wire 132 passes over first lower section 120-1 of second main segment 116-2, conductive wire 132 next passes under a first upper section 122-1 of third main segment 116-3 (which lies sideways adjacent to second main segment 116-2 so that no other segment lies between) before passing over any other lower section 120 of any other main segment 116, and before passing under any other upper section 122 of any other main segment 116.

After conductive wire 132 passes under first upper section 122-1 of third main segment 116-3, conductive wire 132 next passes over a first lower section 120-1 of fourth main segment 116-4 (which lies sideways adjacent to third main segment 116-3 so that no other segment lies between) before passing over any other lower section 120 of any other main segment 116, and before passing under any other upper section 122 of any other main segment 116.

As shown in FIGS. 1A-1C, after conductive wire 132 has passed over the first lower section 120 or passed under the first upper section 122 of a last main segment 116, conductive wire 132 then turns and passes over a second lower section 120 or passes under the second upper section 122 of the last main segment 116.

Thus, once conductive wire 132 has passed under a second upper section 122-2 of fourth main segment 116-4, conductive wire 132 next passes over a second lower section 120-2 of third main segment 116-3 before passing over any other lower section 120 of any other main segment 116, and before passing under any other upper section 122 of any other main segment 116.

After conductive wire 132 has passed over second lower section 120-2 of third main segment 116-3, conductive wire 132 next passes under a second upper section 122-2 of second main segment 116-2 before passing over any other lower section 120 of any other main segment 116, and before passing under any other upper section 122 of any other main segment 116.

Once conductive wire 132 has passed under second upper section 122-2 of second main segment 116-2, conductive wire 132 next passes over a second lower section 120-2 of first main segment 116-1 before passing over any other lower section 120 of any other main segment 116, and before passing under any other upper section 122 of any other main segment 116.

Conductive wire 132 continues on in a similar manner weaving through the third lower and upper sections 120 and 122 of the main segments 116, the fourth lower and upper sections 120 and 122 of the main segments 116, the fifth lower and upper sections 120 and 122 of the main segments 116 and so on, exiting ferromagnetic core 112 after weaving through the last lower and upper sections 120 and 122 of the main segments 116.

Thus, after passing under first upper section 122-1 of first main segment 116-1, conductive wire 132 must pass over first lower section 120-1 of second main segment 116-2 and under second upper section 122-2 of second main segment 116-2 before conductive wire 132 can pass over second lower section 120-2 of first main segment 116-1. Further, as shown in FIGS. 1A-1C, conductive wire 132 passes over no end segment 118 and passes under no end segment 188.

FIGS. 2A-2D through 12A-12D show a series of views that illustrate an example of a method of forming an inductor 200 in accordance with the present invention. FIGS. 2A-12A show a series of plan views, while FIGS. 2B-12B show a series of cross-sectional views taken along lines 2B-20B, respectively, in FIGS. 2A-12A, FIGS. 2C-12C show a series of cross-sectional views taken along lines 2C-12C, respectively, in FIGS. 2A-12A, and FIGS. 2D-12D show a series of cross-sectional views taken along lines 2D-12D, respectively, in FIGS. 2A-12A.

As shown in the FIGS. 2A-2D, the method of forming inductor 200 utilizes a conventionally-formed semiconductor body 210. Body 210, in turn, can be implemented with a conducting material, such as silicon, and an overlying non-conductive layer, such as oxide. In addition, body 210 can include a pair of pads P1 and P2 that touch the overlying non-conductive layer, and which are electrically connected through a metal interconnect structure to transistors, resistors, capacitors, and other elements as required by the circuit. Alternately, body 210 can be implemented with a non-conducting material such as quartz or G10-FR4.

As further shown in FIGS. 2A-2D, the method begins by forming a seed layer 212 on semiconductor body 210. For example, seed layer 212 can be formed by depositing 300 Å of titanium, 3000 Å of copper, and 300 Å of titanium. (Seed layer 212 can also include a barrier layer to prevent copper electromigration if needed.) Once seed layer 212 has been formed, a plating mold 214 is formed on the top surface of seed layer 212. Plating mold 214, in turn, has a number of openings 216 that exposes a portion of seed layer 212.

As shown in FIGS. 3A-3D, following the formation of plating mold 214, the top titanium layer is stripped and a magnetic material, such as an alloy of nickel and iron like permalloy, is deposited by electroplating to form a number of bottom sections 218. As shown in FIGS. 4A-4D, after the electroplating, plating mold 214 and the underlying regions of seed layer 212 are removed.

After the bottom sections 218 have been formed, as shown in FIGS. 5A-5D, a non-conductive layer 220 is deposited on the bottom sections 218 and semiconductor body 210. After non-conductive layer 220 has been deposited, a number of openings 222 are formed in non-conductive layer 220.

In the present example, non-conductive layer 220 is formed with a layer of photoimageable epoxy or polymer, such as SU-8, which is substantially self planarizing. Once the photoimageable epoxy or polymer has been deposited, the openings 222 are formed by projecting a light through a mask to form a patterned image on non-conductive layer 220 that softens the regions of non-conductive layer 220 that are exposed by the light, and then removing the softened regions of non-conductive layer 220.

As shown in FIGS. 6A-6D, after the openings 222 have been formed, a seed layer 224 is formed on non-conductive layer 220. For example, seed layer 224 can be formed by depositing 300 Å of titanium, 3000 Å of copper, and 300 Å of titanium. (Seed layer 224 can also include a barrier layer to prevent copper electromigration if needed.) Once seed layer 224 has been formed, a plating mold 226 is formed on the top surface of the seed layer 224. Plating mold 226, in turn, has an opening 228 that exposes a portion of seed layer 224.

As shown in FIGS. 7A-7D, following the formation of plating mold 226, the top titanium layer is stripped and copper is deposited by electroplating to form a conductive wire 230.

As shown in FIGS. 8A-8D, after the electroplating, plating mold 226 and the underlying regions of seed layer 224 are removed.

After conductive wire 230 has been formed, as shown in FIGS. 9A-9D, a non-conductive layer 240 is deposited on conductive wire 230 and non-conductive layer 220. After non-conductive layer 240 has been deposited, a number of openings 242 are formed in non-conductive layer 240.

In the present example, non-conductive layer 240 is formed with a layer of photoimageable epoxy or polymer, such as SU-8, which is substantially self planarizing. Once the photoimageable epoxy or polymer has been deposited, the openings 242 are formed by projecting a light through a mask to form a patterned image on non-conductive layer 240 that softens the regions of non-conductive layer 240 that are exposed by the light, and then removing the softened regions of non-conductive layer 240. The openings 242 expose the openings 222 which, in turn, expose the bottom sections 218.

As shown in FIGS. 10A-10D, after the openings 242 have been formed, a seed layer 244 is formed on non-conductive layer 240 to line the openings 242 and touch the bottom sections 218. For example, seed layer 244 can be formed by depositing 300 Å of titanium, 3000 Å of copper, and 300 Å of titanium. (Seed layer 244 can also include a barrier layer to prevent copper electromigration if needed.) Once seed layer 244 has been formed, a plating mold 246 is formed on the top surface of the seed layer 244. Plating mold 246, in turn, has a number of openings 248 that exposes a portion of seed layer 244.

As shown in FIGS. 11A-11D, following the formation of plating mold 246, the top titanium layer is stripped and a magnetic material, such as an alloy of nickel and iron like permalloy, is deposited by electroplating to form a number of upper sections 250 that touch the bottom sections 218. As shown in FIGS. 12A-12D, after the electroplating, plating mold 246 and the underlying regions of seed layer 244 are removed to form inductor 200. The method illustrated in FIGS. 2A-2D through 12A-12D can be used to form inductor 100.

Thus, an inductor and a method of forming the inductor have been described. The inductor of the present invention has several advantages. One of the advantages is that the serpentine shape of the ferromagnetic core ensures a low reluctance flux path within the ferromagnetic core. In addition, magnetic gaps can be easily introduced to adjust low current inductance values. Another advantage is that the magnetic material is laminated (thin), which reduces eddy currents and significantly improves the frequency characteristics.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor structure comprising:
   a semiconductor body having a non-conductive top surface;
   a ferromagnetic core touching the non-conductive top surface and having a first main core segment, a second main core segment, a third main core segment, a first end core segment, and a second end core segment, the second main core segment lying between and spaced apart from the first and third main core segments, the first, second, and third main core segments each having a first end and a spaced-apart second end, the first end of the second main core segment lying closer to the first end of the first main core segment than the second end of the first main core segment, and closer to the first end of the third main core segment than the second end of the third main core segment, the first end core segment touching the first end of the first main core segment and the first end of the second main core segment, the second end core segment touching the second end of the second main core segment and the second end of the third main core segment;
   a conductive wire lying substantially in a single plane and having a first main wire segment that lies over a portion of the first main core segment, under a portion of the second main core segment, and over a portion of the third main core segment; and
   a non-conductive region that touches the non-conductive top surface, the ferromagnetic core, and the conductive wire, the non-conductive region surrounding and isolating the conductive wire from the ferromagnetic core.

2. The semiconductor structure of claim 1 wherein the second end core segment is spaced apart from the second end of the first main core segment.

3. The semiconductor structure of claim 2 wherein the first end core segment is spaced apart from the first end of the third main core segment.

4. The semiconductor structure of claim 2 wherein the first main core segment, the second main core segment, and the third main core segment are substantially parallel.

5. The semiconductor structure of claim 4 wherein the first end core segment lies substantially perpendicular to the first and second main core segments.

6. The semiconductor structure of claim 5 wherein the second end core segment lies substantially perpendicular to the second and third main core segments.

7. The semiconductor structure of claim 2 wherein the first, second, and third main core segments each includes a plurality of lower sections that touch the non-conductive top surface, a plurality of upper sections that lie above and spaced apart from the non-conductive top surface, and a plurality of connecting sections that are connected to the plurality of lower sections and the plurality of upper sections.

8. The semiconductor structure of claim 7 wherein each of the plurality of lower sections lies in a first plane, and each of the plurality of upper sections lies in a second plane that is substantially parallel to the first plane.

9. The semiconductor structure of claim 7 wherein the conductive wire has a second main wire segment and an end wire segment, the second main wire segment lies spaced apart from the first main wire segment, the first and second main wire segments each have a first end and a spaced-apart second end, the first end of the second main wire segment lying closer to the first end of the first main wire segment than the second end of the first main wire segment, the end wire segment touching the first end of the first main wire segment and the first end of the second main wire segment, the second main wire segment lies under a portion of the first main core segment, over a portion of the second main core segment, and under a portion of the third main core segment.

10. The semiconductor structure of claim 9 wherein the first main wire segment and the second main wire segment are substantially parallel.

* * * * *